(12) United States Patent
Kitaguchi

(10) Patent No.: US 7,173,308 B2
(45) Date of Patent: Feb. 6, 2007

(54) LATERAL SHORT-CHANNEL DMOS, METHOD FOR MANUFACTURING SAME AND SEMICONDUCTOR DEVICE

(75) Inventor: Makoto Kitaguchi, Tachikawa (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 10/490,509

(22) PCT Filed: Sep. 18, 2003

(86) PCT No.: PCT/JP03/11884

§ 371 (c)(1),
(2), (4) Date: Mar. 23, 2004

(87) PCT Pub. No.: WO2004/038805

PCT Pub. Date: May 6, 2004

(65) Prior Publication Data

US 2004/0251493 A1    Dec. 16, 2004

(30) Foreign Application Priority Data

Oct. 25, 2002 (JP) .............................. 2002-310550

(51) Int. Cl.
*H01L 29/76* (2006.01)
(52) U.S. Cl. ...................... 257/342; 257/335
(58) Field of Classification Search ............... 257/175, 257/133, 139, 335, 339, 341, 340, 336–338, 257/342–343, E29.256, E29.261, E29.279
See application file for complete search history.

(56) References Cited

U.S. PATENT DOCUMENTS 4,866,495 A    9/1989 Kinzer (Continued)

FOREIGN PATENT DOCUMENTS

JP    4-273165    9/1992

(Continued)

OTHER PUBLICATIONS

Japanese Publication No. 8-213617, Published Aug. 20, 1996 with English Equivalent of Abstract from Corresponding Great Britain Publication No. 2295052, Published May 16, 1996; and Translation of Figure 1 from JP Publication No. 8-213617.

(Continued)

*Primary Examiner*—Thao X. Le
(74) *Attorney, Agent, or Firm*—Lowe Hauptman & Berner LLP

(57) ABSTRACT

A lateral short-channel DMOS includes an epitaxial layer formed on a semiconductor substrate. A first conductivity-type well is formed in the epitaxial layer. A second conductivity-type well is formed in the first conductivity-type well and includes a channel forming region. A source region is formed in the second conductivity-type well. A first conductivity-type ON resistance lowering well is formed in the epitaxial layer so as to contact the first conductivity-type well but not the second conductivity-type well, and includes a higher concentration of a first conductivity-type dopant than the first conductivity-type well. A drain region is formed in the first conductivity-type ON resistance lowering well. A gate electrode is formed above and insulated from at least the channel forming region.

12 Claims, 20 Drawing Sheets

U.S. PATENT DOCUMENTS

| | | | |
|---|---|---|---|
| 5,317,180 A * | 5/1994 | Hutter et al. | 257/337 |
| 5,386,136 A * | 1/1995 | Williams et al. | 257/409 |
| 5,811,850 A * | 9/1998 | Smayling et al. | 257/335 |
| 5,827,784 A * | 10/1998 | Loos | 438/750 |
| 5,852,314 A * | 12/1998 | Depetro et al. | 257/343 |
| 6,211,552 B1 * | 4/2001 | Efland et al. | 257/343 |
| 6,380,566 B1 * | 4/2002 | Matsudai et al. | 257/175 |
| 6,399,468 B2 * | 6/2002 | Nishibe et al. | 438/592 |
| 6,404,009 B1 * | 6/2002 | Mori | 257/336 |
| 6,426,260 B1 * | 7/2002 | Hshieh | 438/270 |
| 6,552,392 B2 * | 4/2003 | Beasom | 257/342 |
| 6,559,504 B2 * | 5/2003 | Nishibe et al. | 257/343 |
| 6,608,336 B2 * | 8/2003 | Kikuchi et al. | 257/288 |
| 6,869,847 B2 * | 3/2005 | Mori | 438/286 |
| 6,911,694 B2 * | 6/2005 | Negoro et al. | 257/336 |
| 6,958,515 B2 * | 10/2005 | Hower et al. | 257/341 |
| 2001/0031533 A1 | 10/2001 | Nishibe et al. | |
| 2002/0106860 A1 | 8/2002 | Nishibe et al. | |

FOREIGN PATENT DOCUMENTS

| | | |
|---|---|---|
| JP | 6-132527 | 5/1994 |

OTHER PUBLICATIONS

Yamazaki, Hiroshi. "Pawaa MOSFET no Ouyou Gijutsu." First Edition, Eight Impression, Published Oct. 23, 1998, pp. 9-12; and English Translation of Figure 2.1.

* cited by examiner

LATERAL SHORT-CHANNEL DMOS, METHOD FOR MANUFACTURING SAME AND SEMICONDUCTOR DEVICE

TECHNICAL FIELD

The present invention relates to a lateral short-channel DMOS that can be favorably used as a power MOSFET and a method of manufacturing the same. The present invention also relates to a semiconductor device equipped with this lateral short-channel DMOS.

RELATED ART

FIG. 13 is a cross-sectional view showing a conventional lateral short-channel DMOS 90. As shown in FIG. 13, this lateral short-channel DMOS 90 includes an $N^-$-type epitaxial layer 910 formed in a surface of a $P^-$-type semiconductor substrate 908, a P-type well 914 that is formed in a surface of the $N^-$-type epitaxial layer 910 and includes a channel forming region C, an $N^+$-type source region 916 that is formed in a surface of the P-type well 914, an $N^+$-type drain region 918 formed in a surface of the $N^-$-type epitaxial layer 910, and a polysilicon gate electrode 922 formed in an upper part of the channel forming region C via a gate insulating film 920 (see, for example, page 2 and FIG. 1 of Japanese Laid-Open Patent Publication No. H08-213617 and FIG. 2.1 and pages 9 to 12 in "Pawaa MOSFET no Ouyou Gijutsu" (Power MOSFET Applications) by Hiroshi Yamazaki (First Edition, Eighth Impression) published on 23 Oct. 1998 by Nikkan Kougyou Shimbunsha).

In this lateral short-channel DMOS 90, the $N^+$-type source region 916 is connected to a source terminal, not shown, via a source electrode 926, the $N^+$-type drain region 918 is connected to a drain terminal, not shown, via a drain electrode 928, and a polysilicon gate electrode 922 is connected to a gate terminal, not shown. The $P^-$-type semiconductor substrate 908 is connected to ground 932 that is fixed at 0V.

However, this lateral short-channel DMOS 90 has had the problem that high-speed switching is not easy due to the high resistance of the polysilicon gate electrode.

FIG. 14 is a cross-sectional view of another conventional lateral short-channel DMOS 92. As shown in FIG. 14, this lateral short-channel DMOS 92 is constructed so that a gate resistance lowering metal layer 930 formed on an interlayer dielectric 924 is connected to the polysilicon gate electrode 922. According to this lateral short-channel DMOS 92, since the gate resistance lowering metal layer 930 is connected to the polysilicon gate electrode 922, the overall resistance of the gate electrode layer is lowered, so that high-speed switching is possible.

However, in this lateral short-channel DMOS 92, a contact hole (A) needs to be provided in the interlayer dielectric 924 to connect the polysilicon gate electrode 922 and the gate resistance lowering metal layer 930 and an isolation region (B) needs to be provided to electrically isolate the gate resistance lowering metal layer 930 from the source electrode 926 and the drain electrode 928, so that the gate length of the polysilicon gate electrode 922 becomes extended, resulting in the problem that the ON resistance is high.

The present invention was conceived in order to solve the problems described above, and it is an object of the present invention to provide a lateral short-channel DMOS with low gate resistance and a low ON resistance, as well as superior high-speed switching characteristics and superior current driving characteristics. It is a further object of the present invention to provide a method of manufacturing this superior lateral short-channel DMOS.

DISCLOSURE OF THE INVENTION

A lateral short-channel DMOS according to a first aspect of the present invention includes:

a first conductivity-type epitaxial layer formed on a surface of a semiconductor substrate;

a second conductivity-type well that is formed in a surface of the first conductivity-type epitaxial layer and includes a channel forming region, the second conductivity type being an inverse of the first conductivity type;

a first conductivity-type source region that is formed in the second conductivity-type well;

a first conductivity-type ON resistance lowering well that is formed in the surface of the first conductivity-type epitaxial layer so as to not contact the second conductivity-type well and includes a higher concentration of a first conductivity-type dopant than the first conductivity-type epitaxial layer;

a first conductivity-type drain region formed in a surface of the first conductivity-type ON resistance lowering well;

a gate electrode formed, via a gate insulating film, in at least an upper part of the channel forming region out of a region from the first conductivity-type source region to the first conductivity-type drain region; and a gate resistance lowering metal layer connected to the gate electrode.

This means that according to the lateral short-channel DMOS according to the first aspect of the present invention, the first conductivity-type ON resistance lowering well is formed in the surface of the first conductivity-type epitaxial layer so as to not contact the second conductivity-type well and the first conductivity-type drain region is formed in a surface of the first conductivity-type ON resistance lowering well, so that when the DMOS is ON, the first conductivity-type ON resistance lowering well that has low resistance forms a large part of the current path between the first conductivity-type source region and the first conductivity-type drain region, therefore the overall ON resistance can be sufficiently lowered even when the gate length is extended to lower the gate resistance. Accordingly, the lateral short-channel DMOS according to the first aspect of the present invention has a low gate resistance and a low ON resistance, as well as superior high-speed switching characteristics and superior current driving characteristics.

Also, according to the lateral short-channel DMOS according to the first aspect of the present invention, the first conductivity-type ON resistance lowering well that includes a higher concentration of first conductivity-type dopant than the first conductivity-type epitaxial layer is provided separately, so that it is possible to lower the ON resistance when the DMOS is ON without increasing the concentration of dopant in the first conductivity-type epitaxial layer itself and therefore there is no decrease in the breakdown characteristics of the lateral short-channel DMOS.

For the lateral short-channel DMOS according to the first aspect of the present invention, the concentration of dopant in the first conductivity-type ON resistance lowering well should preferably be at least $1 \times 10^{+18}$ ions/cm$^3$ and the concentration of dopant in the first conductivity-type epitaxial layer should preferably be no more than $1 \times 10^{+17}$ ions/cm$^3$.

With the above construction, the resistance of the first conductivity-type ON resistance lowering well can be sufficiently lowered and it is also possible to sufficiently maintain the breakdown characteristics of the lateral short-channel DMOS. In view of this point, the concentration of dopant in the first conductivity-type ON resistance lowering well should more preferably be at least $2 \times 10^{+18}$ ions/cm$^3$, and even more preferably be at least $5 \times 10^{+18}$ ions/cm$^3$. The concentration of dopant in the first conductivity-type epitaxial layer should more preferably be no more than $5 \times 10^{+16}$ ions/cm$^3$, and even more preferably be no more than $2 \times 10^{+16}$ ions/cm$^3$.

With the lateral short-channel DMOS according to the first aspect of the present invention, it is preferable that a second conductivity-type diffused region is formed in a floating state in the surface of the first conductivity-type epitaxial layer in a region between the second conductivity-type well and the first conductivity-type drain region so as to not contact the second conductivity-type well.

With the above construction, it is possible to ease the electric field strength during reverse bias in a vicinity of the region in which the second conductivity-type diffused region is formed, so that the breakdown characteristics can be stabilized further. It should be noted that when the DMOS is ON, the current between the first conductivity-type drain region and the first conductivity-type source region avoids the second conductivity-type dispersed region and flows in a deeper part (the first conductivity-type epitaxial layer) than the second conductivity-type diffused region, so that there is no increase in the ON resistance.

In view of this point, the concentration of dopant in the second conductivity-type diffused region should preferably be in a range of $3 \times 10^{+16}$ ions/cm$^3$ to $5 \times 10^{+18}$ ions/cm$^3$, and more preferably in a range of $1 \times 10^{+17}$ ions/cm$^3$ to $1 \times 10^{+18}$ ions/cm$^3$.

With the lateral short-channel DMOS according to the first aspect of the present invention, it is preferable that the second conductivity-type diffused region is formed so as to not contact the first conductivity-type ON resistance lowering well.

With the above construction, since the second conductivity-type diffused region that is not biased is constructed so as to not contact the first conductivity-type ON resistance lowering well, it is possible to thoroughly suppress a worsening of the breakdown characteristics and increases in leak currents.

With the lateral short-channel DMOS according to the first aspect of the present invention, it is preferable that in a region from the second conductivity-type diffused region to the first conductivity-type drain region, the gate electrode is provided opposite the first conductivity-type epitaxial layer with a field oxide film in between.

With the above construction, the electric field strength during reverse bias in a vicinity of the region in which the second conductivity-type diffused region is formed is eased, so that it is possible to increase the thickness of the gate insulating film in a region from the second conductivity-type diffused region to the first conductivity-type drain region. This means that it is possible to use a construction where the gate electrode is provided opposite the first conductivity-type epitaxial layer with the field oxide film in between, and as a result, a capacity between the gate and the source and between the gate and the drain can be reduced, thereby making it possible to further improve the high-speed switching characteristics.

A lateral short-channel DMOS according to a second aspect of the present invention includes:

an epitaxial layer formed on a surface of a semiconductor substrate;

a first conductivity-type well formed in a surface of the epitaxial layer;

a second conductivity-type well that is formed in a surface of the first conductivity-type well and includes a channel forming region, the second conductivity type being an inverse of the first conductivity type;

a first conductivity-type source region that is formed in a surface of the second conductivity-type well;

a first conductivity-type ON resistance lowering well that is formed in a surface of the epitaxial layer so as to contact the first conductivity-type well and to not contact the second conductivity-type well, and includes a higher concentration of a first conductivity-type dopant than the first conductivity-type well;

a first conductivity-type drain region formed in a surface of the first conductivity-type ON resistance lowering well;

a gate electrode formed, via a gate insulating film, in an upper part of at least the channel forming region out of a region from the first conductivity-type source region to the first conductivity-type drain region; and a gate resistance lowering metal layer connected to the gate electrode.

This means that according to the lateral short-channel DMOS according to the second aspect of the present invention, the first conductivity-type ON resistance lowering well is formed in the surface of the epitaxial layer so as to not contact the second conductivity-type well and the first conductivity-type drain region is formed in a surface of the first conductivity-type ON resistance lowering well, so that when the DMOS is ON, the first conductivity-type ON resistance lowering well that has low resistance forms a large part of the current path between the first conductivity-type source region and the first conductivity-type drain region, therefore the overall ON resistance can be sufficiently lowered even when the gate length is extended to lower the gate resistance. Accordingly, the lateral short-channel DMOS according to the second aspect of the present invention has a low gate resistance and a low ON resistance, as well as superior high-speed switching characteristics and superior current driving characteristics.

Also, according to the lateral short-channel DMOS according to the second aspect of the present invention, the first conductivity-type ON resistance lowering well that includes a higher concentration of first conductivity-type dopant than the first conductivity-type well is provided separately, so that it is possible to lower the resistance when the DMOS is ON without increasing the concentration of dopant in the first conductivity-type well and therefore there is no decrease in the breakdown characteristics of the lateral short-channel DMOS.

In addition, in a semiconductor device where this lateral short-channel DMOS has been integrated with other elements (such as logic elements), since the first conductivity-type well is formed inside the epitaxial layer, it is possible to control the breakdown characteristics of the lateral short-channel DMOS via the concentration of dopant in the first conductivity-type well, so that the concentration of dopant in the epitaxial layer can be set at an appropriate concentration (for example, a lower concentration than the first conductivity-type well) for the other elements (such as logic elements), therefore a semiconductor device with more superior characteristics can be provided.

For the lateral short-channel DMOS according to the second aspect of the present invention, the concentration of dopant in the first conductivity-type ON resistance lowering well should preferably be at least $1 \times 10^{+18}$ ions/cm$^3$ and the concentration of dopant in the first conductivity-type well should preferably be no more than $1 \times 10^{+17}$ ions/cm$^3$.

With the above construction, the resistance of the first conductivity-type ON resistance lowering well can be sufficiently lowered and it is also possible to sufficiently maintain the breakdown characteristics of the lateral short-channel DMOS. In view of this point, the concentration of dopant in the first conductivity-type ON resistance lowering well should more preferably be at least $2 \times 10^{+18}$ ions/cm$^3$, and even more preferably be at least $5 \times 10^{+18}$ ions/cm$^3$. The concentration of dopant in the first conductivity-type well should more preferably be no more than $5 \times 10^{+16}$ ions/cm$^3$, and even more preferably be no more than $2 \times 10^{+16}$ ions/cm$^3$.

With the lateral short-channel DMOS according to the second aspect of the present invention, it is preferable that a second conductivity-type diffused region is formed in a floating state in the surface of the first conductivity-type well in a region between the second conductivity-type well and the first conductivity-type drain region so as to not contact the second conductivity-type well.

With the above construction, it is possible to ease the electric field strength during reverse bias in a vicinity of the region in which the second conductivity-type diffused region is formed, so that the breakdown characteristics can be stabilized further. It should be noted that when the DMOS is ON, the current between the first conductivity-type drain region and the first conductivity-type source region avoids the second conductivity-type diffused region and flows in a deeper part (the first conductivity-type well) than the second conductivity-type diffused region, so that there is no increase in the ON resistance.

In view of this point, the concentration of dopant in the second conductivity-type diffused region should preferably be in a range of $3 \times 10^{+16}$ ions/cm$^3$ to $5 \times 10^{+18}$ ions/cm$^3$, and more preferably in a range of $1 \times 10^{+17}$ ions/cm$^3$ to $1 \times 10^{+18}$ ions/cm$^3$.

With the lateral short-channel DMOS according to the second aspect of the present invention, it is preferable that the second conductivity-type diffused region is formed so as to not contact the first conductivity-type ON resistance lowering well.

With the above construction, since the second conductivity-type diffused region that is not biased is constructed so as to not contact the first conductivity-type ON resistance lowering well, it is possible to thoroughly suppress a worsening of the breakdown characteristics and increases in leak currents.

With the lateral short-channel DMOS according to the second aspect of the present invention, it is preferable that in a region from the second conductivity-type diffused region to the first conductivity-type drain region, the gate electrode is provided opposite the epitaxial layer with a field oxide film in between.

With the above construction, the electric field strength during reverse bias in a vicinity of the region in which the second conductivity-type diffused region is formed is eased, so that it is possible to increase the thickness of the gate insulating film in a region from the second conductivity-type diffused region to the first conductivity-type drain region. This means that it is possible to use a construction where the gate electrode is provided opposite the epitaxial layer with the field oxide film in between, and as a result, a capacity between the gate and the source and between the gate and the drain can be reduced, thereby making it possible to further improve the high-speed switching characteristics.

A lateral short-channel DMOS according to a third aspect of the present invention includes:

a first conductivity-type well formed in a surface of a semiconductor substrate;

a second conductivity-type well that is formed in a surface of the first conductivity-type well and includes a channel forming region, the second conductivity type being an inverse of the first conductivity type;

a first conductivity-type source region that is formed in a surface of the second conductivity-type well;

a first conductivity-type ON resistance lowering well that is formed in a surface of the semiconductor substrate so as to contact the first conductivity-type well and not contact the second conductivity-type well, and includes a higher concentration of a first conductivity-type dopant than the first conductivity-type well;

a first conductivity-type drain region formed in a surface of the first conductivity-type ON resistance lowering well;

a gate electrode formed, via a gate insulating film, in an upper part of at least the channel forming region out of a region from the first conductivity-type source region to the first conductivity-type drain region; and a gate resistance lowering metal layer connected to the gate electrode.

This means that according to the lateral short-channel DMOS according to the third aspect of the present invention, the first conductivity-type ON resistance lowering well is formed in the surface of the semiconductor substrate so as to contact the first conductivity-type well and not contact the second conductivity-type well and the first conductivity-type drain region is formed in a surface of the first conductivity-type ON resistance lowering well, so that when the DMOS is ON, the first conductivity-type ON resistance lowering well that has low resistance forms a large part of the current path between the first conductivity-type source region and the first conductivity-type drain region, therefore the overall ON resistance can be sufficiently lowered even when the gate length is extended to lower the gate resistance. Accordingly, the lateral short-channel DMOS according to the third aspect of the present invention has a low gate resistance and a low ON resistance, as well as superior high-speed switching characteristics and superior current driving characteristics.

Also, according to the lateral short-channel DMOS according to the third aspect of the present invention, the first conductivity-type ON resistance lowering well that includes a higher concentration of first conductivity-type dopant than the first conductivity-type well is provided separately, so that it is possible to lower the ON resistance when the DMOS is ON without increasing the concentration of dopant in the first conductivity-type well and therefore there is no decrease in the breakdown characteristics of the lateral short-channel DMOS.

In addition, although the first conductivity-type well needs to be formed relatively deeply from the surface of the semiconductor substrate in order to maintain the breakdown characteristics of the lateral short-channel DMOS, the first conductivity-type ON resistance lowering well only needs to act as a current path from the first conductivity-type drain region to the first conductivity-type source region and so may be formed relatively shallowly from the surface of the semiconductor substrate. This means that little extension in the horizontal direction is required when forming the first conductivity-type ON resistance lowering well, and as a result, the element area of the lateral short-channel DMOS does not become particularly large.

Also, since a first conductivity-type ON resistance lowering well is formed, the length is suppressed for a depletion layer formed with a large width from a PN junction formed by the second conductivity-type well and the first conductivity-type well during reverse bias towards the first conductivity-type drain region, resulting in the effect that the breakdown characteristics can be stabilized without the electric field strength at the surface of the semiconductor substrate becoming large.

For the lateral short-channel DMOS according to the third aspect of the present invention, the concentration of dopant in the first conductivity-type ON resistance lowering well should preferably be at least $1 \times 10^{+18}$ ions/cm$^3$ and the concentration of dopant in the first conductivity-type well should preferably be no more than $1 \times 10^{+17}$ ions/cm$^3$.

With the above construction, the resistance of the first conductivity-type ON resistance lowering well can be sufficiently lowered and it is also possible to sufficiently maintain the breakdown characteristics of the lateral short-channel DMOS. In view of this point, the concentration of dopant in the first conductivity-type ON resistance lowering well should more preferably be at least $2 \times 10^{+18}$ ions/cm$^3$, and even more preferably be at least $5 \times 10^{+18}$ ions/cm$^3$. The concentration of dopant in the first conductivity-type well should more preferably be no more than $5 \times 10^{+16}$ ions/cm$^3$, and even more preferably be no more than $2 \times 10^{+16}$ ions/cm$^3$.

With the lateral short-channel DMOS according to the third aspect of the present invention, it is preferable that a second conductivity-type diffused region is formed in a floating state in the surface of the first conductivity-type well in a region between the second conductivity-type well and the first conductivity-type drain region so as to not contact the second conductivity-type well.

With the above construction, it is possible to ease the electric field strength during reverse bias in a vicinity of the region in which the second conductivity-type diffused region is formed, so that the breakdown characteristics can be stabilized further. It should be noted that when the DMOS is ON, the current between the first conductivity-type drain region and the first conductivity-type source region avoids the second conductivity-type diffused region and flows in a deeper part (the first conductivity-type well) than the second conductivity-type diffused region, so that there is no increase in the ON resistance.

In view of this point, the concentration of dopant in the second conductivity-type diffused region should preferably be in a range of $3 \times 10^{+16}$ ions/cm$^3$ to $5 \times 10^{+18}$ ions/cm$^3$, and more preferably in a range of $1 \times 10^{+17}$ ions/cm$^3$ to $1 \times 10^{+18}$ ions/cm$^3$.

With the lateral short-channel DMOS according to the third aspect of the present invention, it is preferable that the second conductivity-type diffused region is formed so as to not contact the first conductivity-type ON resistance lowering well.

With the above construction, since the second conductivity-type diffused region that is not biased is constructed so as to not contact the first conductivity-type ON resistance lowering well, it is possible to thoroughly suppress a worsening of the breakdown characteristics and increases in leak currents.

With the lateral short-channel DMOS according to the third aspect of the present invention, it is preferable that in a region from the second conductivity-type diffused region to the first conductivity-type drain region, the gate electrode is provided opposite the semiconductor substrate with a field oxide film in between.

With the above construction, the electric field strength during reverse bias in a vicinity of the region in which the second conductivity-type diffused region is formed is eased, so that it is possible to increase the thickness of the gate insulating film in a region from the second conductivity-type diffused region to the first conductivity-type drain region. This means that it is possible to use a construction where the gate electrode is provided opposite the semiconductor substrate with the field oxide film in between, and as a result, a capacity between the gate and the source and between the gate and the drain can be reduced, thereby making it possible to further improve the high-speed switching characteristics.

As described above, as should be clear from the lateral short-channel DMOS according to the first to third aspects, in the lateral short-channel DMOS according to the present invention the current that flows between the first conductivity-type source region, which is formed in the surface of the second conductivity-type well that includes the channel forming region, and the first conductivity-type drain region can be controlled by a voltage applied to the gate electrode formed via the gate insulating film in an upper part of at least the channel forming region out of a region from the first conductivity-type source region to the first conductivity-type drain region, where the first conductivity-type drain region is formed in the surface of the first conductivity-type ON resistance lowering well that is formed so as to not contact the second conductivity-type well.

In the lateral short-channel DMOS according to the first to third aspects of the present invention, silicon can be favorably used as the semiconductor substrate. Polysilicon, tungsten silicide, molybdenum silicide, tungsten, molybdenum, copper, aluminum, and the like can be favorably used as the material of the gate electrode. Also, tungsten, molybdenum, copper, aluminum, and the like can be favorably used as the gate electrode resistance lowering metal.

It should be noted that in the lateral short-channel DMOS according to the present invention, it is possible to set the second conductivity-type at P-type and the first conductivity-type at N-type or to set the second conductivity-type at N-type and the first conductivity-type at P-type.

A "method of manufacturing a lateral short-channel DMOS" according to a first aspect of the present invention is a method of manufacturing "the lateral short-channel DMOS" according to the first aspect of the present invention and includes the following steps in order:

(a) a first step of preparing the semiconductor substrate with the first conductivity-type epitaxial layer formed on the surface thereof;

(b) a second step of forming a first ion implanting mask with a predetermined opening on a surface of the first conductivity-type epitaxial layer and forming the first conductivity-type ON resistance lowering well by implanting first conductivity-type dopant with the first ion implanting mask as a mask;

(c) a third step of forming, after removal of the first ion implanting mask, a second ion implanting mask with a predetermined opening on the surface of the first conductivity-type epitaxial layer and forming the second conductivity-type well so as to not contact the first conductivity-type ON resistance lowering well by implanting second conductivity-type dopant with the second ion implanting mask as a mask;

(d) a fourth step of forming, after removal of the second ion implanting mask, a field oxide film with a predetermined opening in the surface of the first conductivity-type epitaxial layer and forming the gate insulating film by thermal oxidization at the opening in the field oxide film;

(e) a fifth step of forming the gate electrode in a predetermined region on the gate insulating film; and (f) a sixth step of forming the first conductivity-type source region and the first conductivity-type drain region by implanting first conductivity-type dopant with at least the gate electrode and the field oxide film as a mask.

This means that the superior "lateral short-channel DMOS" according to the first aspect of the present invention can be obtained by the "method of manufacturing a lateral short-channel DMOS" according to the first aspect of the present invention.

A "method of manufacturing a lateral short-channel DMOS" according to a second aspect of the present invention is a method of manufacturing "the lateral short-channel DMOS" according to the second aspect of the present invention and includes the following steps in order:

(a) a first step of preparing the semiconductor substrate with the epitaxial layer formed on the surface thereof;

(b) a second step of forming a first ion implanting mask with a predetermined opening on a surface of the epitaxial layer and forming the first conductivity-type well by implanting first conductivity-type dopant into the semiconductor substrate with the first ion implanting mask as a mask;

(c) a third step of forming, after removal of the first ion implanting mask, a second ion implanting mask with a predetermined opening on the surface of the epitaxial layer and forming the first conductivity-type ON resistance lowering well so as to contact the first conductivity-type well by implanting first conductivity-type dopant with a higher concentration than the second step with the second ion implanting mask as a mask;

(d) a fourth step of forming, after removal of the second ion implanting mask, a third ion implanting mask with a predetermined opening on the surface of the epitaxial layer and forming the second conductivity-type well so as to not contact the first conductivity-type ON resistance well by implanting second conductivity-type dopant with the third ion implanting mask as a mask;

(e) a fifth step of forming, after removal of the third ion implanting mask, a field oxide film with a predetermined opening in the surface of the epitaxial layer and forming the gate insulating film by thermal oxidization at the opening in the field oxide film;

(f) a sixth step of forming the gate electrode in a predetermined region on the gate insulating film; and (g) a seventh step of forming the first conductivity-type source region and the first conductivity-type drain region by implanting first conductivity-type dopant with at least the gate electrode and the field oxide film as a mask.

This means that the superior "lateral short-channel DMOS" according to the second aspect of the present invention can be obtained by the "method of manufacturing a lateral short-channel DMOS" according to the second aspect of the present invention.

A "method of manufacturing a lateral short-channel DMOS" according to a third aspect of the present invention is a method of manufacturing "the lateral short-channel DMOS" according to the third aspect of the present invention and includes the following steps in order:

(a) a first step of preparing a semiconductor substrate;

(b) a second step of forming a first ion implanting mask with a predetermined opening on a surface of the semiconductor substrate and forming the first conductivity-type well by implanting first conductivity-type dopant into the semiconductor substrate with the first ion implanting mask as a mask;

(c) a third step of forming, after removal of the first ion implanting mask, a second ion implanting mask with a predetermined opening on a surface of the semiconductor substrate and forming the first conductivity-type ON resistance lowering well so as to contact the first conductivity-type well by implanting first conductivity-type dopant with a higher concentration than the second step with the second ion implanting mask as a mask;

(d) a fourth step of forming, after removal of the second ion implanting mask, a third ion implanting mask with a predetermined opening on a surface of the semiconductor substrate and forming the second conductivity-type well so as to not contact the first conductivity-type ON resistance well by implanting second conductivity-type dopant with the third ion implanting mask as a mask;

(e) a fifth step of forming, after removal of the third ion implanting mask, a field oxide film with a predetermined opening in a surface of the semiconductor substrate, and forming the gate insulating film by thermal oxidization at the opening in the field oxide film;

(f) a sixth step of forming the gate electrode in a predetermined region on the gate insulating film; and (g) a seventh step of forming the first conductivity-type source region and the first conductivity-type drain region by implanting first conductivity-type dopant with at least the gate electrode and the field oxide film as a mask.

This means that the superior "lateral short-channel DMOS" according to the third aspect of the present invention can be obtained by the "method of manufacturing a lateral short-channel DMOS" according to the third aspect of the present invention.

The semiconductor device according to the present invention includes a lateral short-channel DMOS according to any of the first to third aspects.

The semiconductor device according to the present invention is a superior power control semiconductor device since it includes a lateral short-channel DMOS with low gate resistance and low ON resistance as well as superior high-speed switching characteristics and current driving characteristics.

The semiconductor device according to the present invention can also include logic circuits. By using this construction, the semiconductor device according to the present invention is a superior power control semiconductor device since it includes a lateral short-channel DMOS with low gate resistance and low ON resistance as well as superior high-speed switching characteristics and current driving characteristics, as well as logic circuits for controlling the lateral short-channel DMOS.

In the semiconductor device according to the present invention, it is preferable to use the lateral short-channel DMOS according to the second aspect described above as the lateral short-channel DMOS. When this construction is used, a lateral short-channel DMOS in which the first conductivity-type well is formed inside the epitaxial layer is used, so that the breakdown characteristics of the lateral short-channel DMOS can be controlled via the concentration of dopant in the first conductivity-type well. As a result, the concentration of dopant in the epitaxial layer can be set at a concentration suited to the logic circuits (for example, a lower concentration than the first conductivity-type well), so that a power control semiconductor device with superior characteristics can be produced.

BEST MODE FOR CARRYING OUT THE PRESENT INVENTION

Embodiments of the present invention are described in detail below with reference to the attached drawings.

Embodiment 1A

Figure 1A:
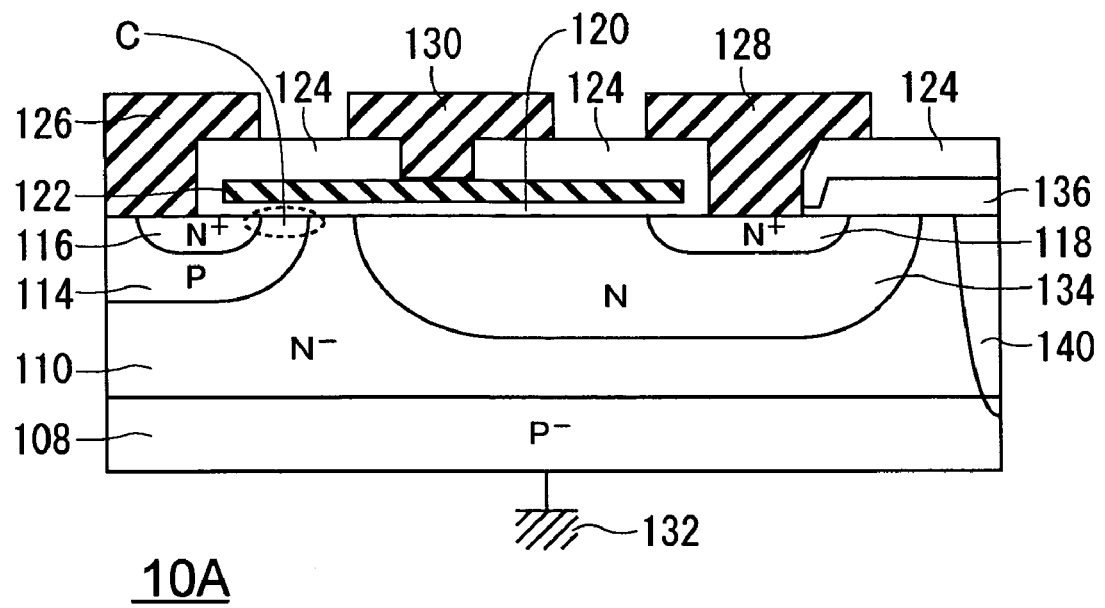
FIG. 1A is a cross-sectional view of a lateral short-channel DMOS according to embodiment 1A.

FIG. 1A is a cross-sectional view of a lateral short-channel DMOS according to embodiment 1A of the present invention. A lateral short-channel DMOS 10A according to this embodiment 1A is a lateral short-channel DMOS according to a first aspect of the present invention, and as shown in FIG. 1A, has an N$^-$-type epitaxial layer (first conductivity-type epitaxial layer) 110 formed on a surface of a P$^-$-type semiconductor substrate (semiconductor substrate) 108. A P-type well (second conductivity-type well) 114 including a channel forming region C is formed in a surface of the N$^-$-type epitaxial layer 110, and an N$^+$-type source region (first conductivity-type source region) 116 is formed in a surface of the P-type well 114. On the other hand, an ON resistance lowering N-type well (first conductivity-type ON resistance lowering well) 134 is formed in a surface of the N$^-$-type epitaxial layer 110 so as to not contact the P-type well 114. An N$^+$-type drain region (first conductivity-type drain region) 118 is formed in a surface of this ON resistance lowering N-type well 134.

A polysilicon gate electrode 122 is formed via a gate insulating film 120 in at least an upper part of the channel forming region C, out of a region from the N$^+$-type source region 116 to the N$^+$-type drain region 118. The polysilicon gate electrode 122 is connected to a gate resistance lowering metal layer 130. An element isolating region 140 is also formed on a right side of the N$^+$-type drain region 118.

This means that according to the lateral short-channel DMOS 10A according to embodiment 1A, the ON resistance lowering N-type well 134 is formed in the N$^-$-type epitaxial layer 110 so as to not contact the P-type well 114 and the N$^+$-type drain region 118 is formed in the surface of the ON resistance lowering N-type well 134, so that when the DMOS 10A is ON, the ON resistance lowering N-type well 134 that has low resistance forms a large part of the current path from the N$^+$-type drain region 118 to the N$^+$-type source region 116 and the overall ON resistance can be sufficiently lowered even when the gate length is extended to lower the gate resistance. Accordingly, the lateral short-channel DMOS 10A according to embodiment 1A has a low gate resistance and a low ON resistance, as well as superior high-speed switching characteristics and superior current driving characteristics.

Also, according to the lateral short-channel DMOS 10A according to embodiment 1A, the ON resistance lowering N-type well 134 that includes a higher concentration of N-type dopant than the N$^-$-type epitaxial layer 110 is provided separately, so that the resistance when the DMOS 10A is ON can be lowered without increasing the concentration of dopant in the N$^-$-type epitaxial layer 110 itself and there is no worsening in the breakdown characteristics of the lateral short-channel DMOS.

In the lateral short-channel DMOS 10A according to embodiment 1A, the depth of the P-type well 114 is 1.5 μm, for example, the depth of the N$^+$-type source region 116 is 0.3 μm, for example, the depth of the N$^+$-type drain region 118 is 0.3 μm, for example, and the depth of the ON resistance lowering N-type well 134 is 2 μm, for example.

In the lateral short-channel DMOS 10A according to embodiment 1A, the dopant concentration of the ON resistance lowering N-type well 134 is 1×10$^{+19}$ ions/cm$^3$, for example, and the dopant concentration of the N⁻-type epitaxial layer 110 is $1\times10^{+16}$ ions/cm³, for example.

Embodiment 1B

Figure 1B:
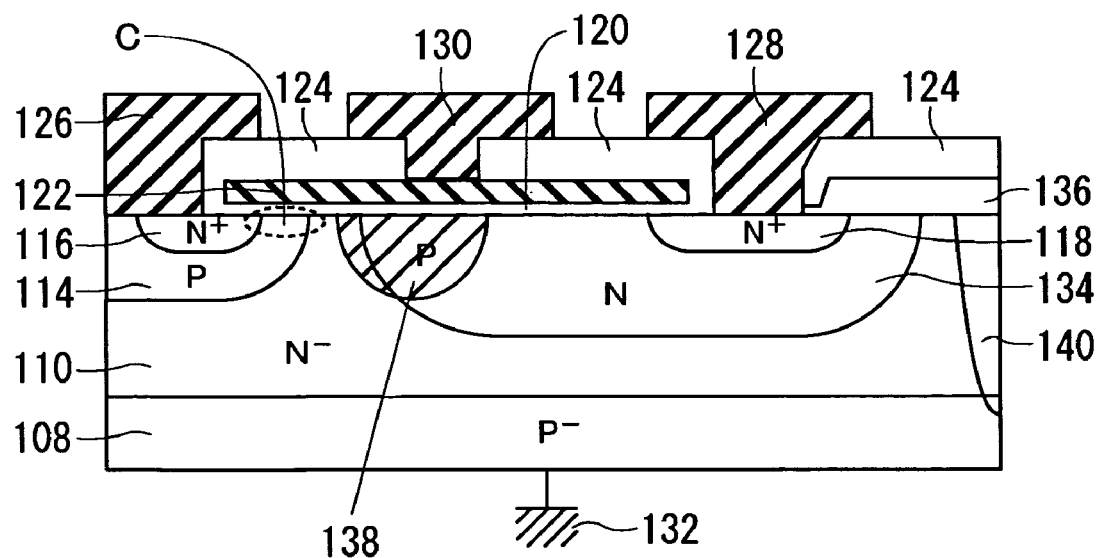
FIG. 1B is a cross-sectional view of a lateral short-channel DMOS according to embodiment 1B.

FIG. 1B is a cross-sectional view of a lateral short-channel DMOS according to embodiment 1B. A lateral short-channel DMOS 10B according to embodiment 1B has a similar structure to the lateral short-channel DMOS 10A according to embodiment 1A, but as shown in FIG. 1B, the difference is that a P-type diffused region (second conductivity-type diffused region) 138 is formed in a floating state in a region between the P-type well 114 and the N⁺-type drain region 118 in a surface of the N⁻-type epitaxial layer 110 so as to not contact the P-type well 114.

According to the lateral short-channel DMOS 10B according to embodiment 1B, the following effect is obtained in addition to the effects of the lateral short-channel DMOS 10A according to embodiment 1A. That is, an electric field strength in the region in which the P-type diffused region 138 is formed is eased during reverse bias, so that the breakdown characteristics can be stabilized further.

It should be noted that when the DMOS 10B is ON, the current from the N⁺-type drain region 118 to the N⁺-type source region 116 avoids the P-type diffused region 138 and flows in a deeper part (the N⁻-type epitaxial layer 110) than the P-type diffused region 138, so that there is no increase in the ON resistance due to the provision of the P-type diffused region 138.

In the lateral short-channel DMOS 10B according to embodiment 1B, the dopant concentration of the P-type diffused region 138 is $3\times10^{+17}$ ions/cm³, for example.

Embodiment 1C

Figure 1C:
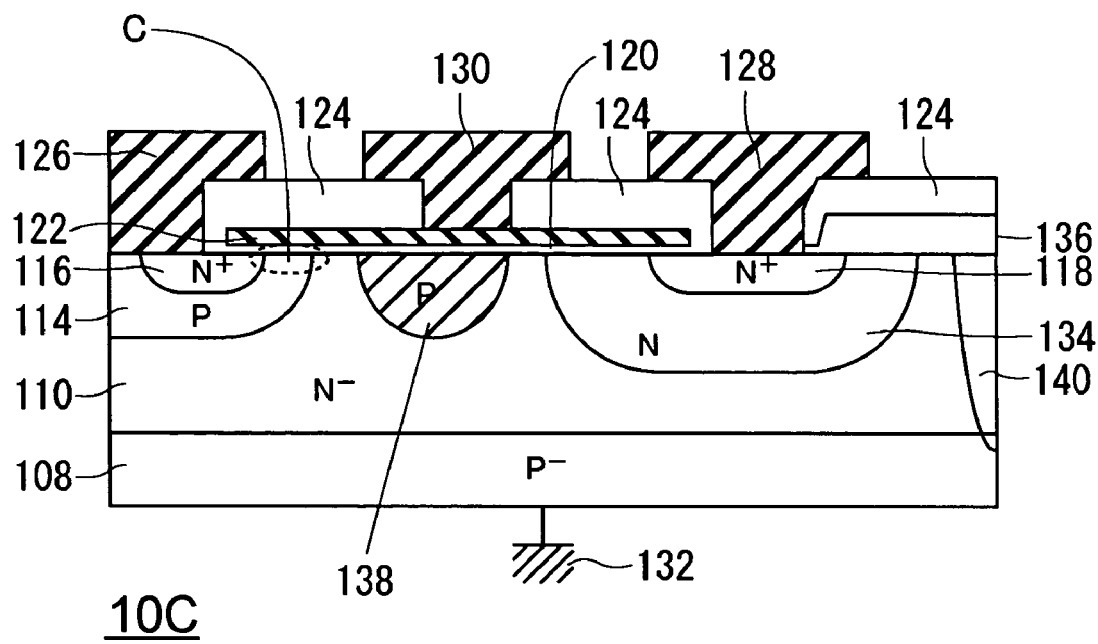
FIG. 1C is a cross-sectional view of a lateral short-channel DMOS according to embodiment 1C.

FIG. 1C is a cross-sectional view of a lateral short-channel DMOS according to embodiment 1C. A lateral short-channel DMOS 10C according to embodiment 1C has a similar construction to the lateral short-channel DMOS 10B according to embodiment 1B, with the difference being that the P-type diffused region 138 is formed so as to not contact the ON resistance lowering N-type well 134.

This means that in addition to the effects of the lateral short-channel DMOS 10B according to embodiment 1B, the lateral short-channel DMOS 10C according to embodiment 1C has the following effect. That is, since the P-type diffused region 138 that is not biased is constructed so as to not contact the ON resistance lowering N-type well 134, it is possible to thoroughly suppress a worsening of the breakdown characteristics and increases in leak currents.

Embodiment 1D

Figure 1D:
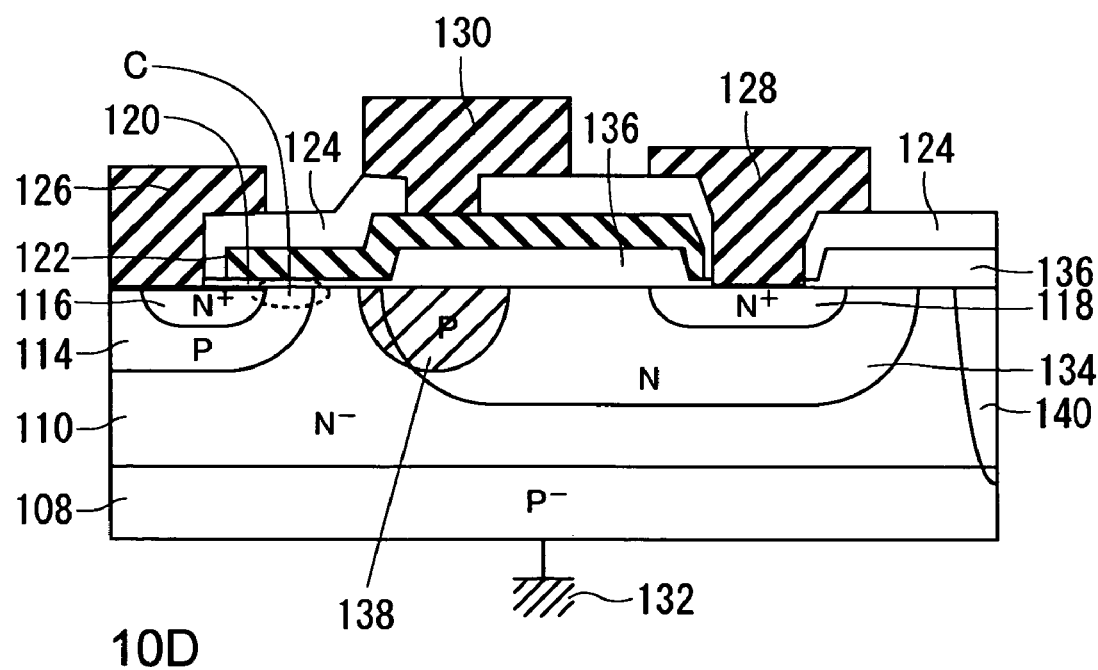
FIG. 1D is a cross-sectional view of a lateral short-channel DMOS according to embodiment 1D.

FIG. 1D is a cross-sectional view of a lateral short-channel DMOS according to embodiment 1D. A lateral short-channel DMOS 10D according to embodiment 1D has a similar construction to the lateral short-channel DMOS 10B according to embodiment 1B, with as shown in FIG. 1D, the difference being that in a region from the P-type diffused region 138 to the N⁺-type drain region 118, the polysilicon gate electrode 122 is provided opposite the N⁻-type epitaxial layer 110 with a field oxide film 136 in between.

This means that in addition to the effects of the lateral short-channel DMOS 10B according to embodiment 1B, the lateral short-channel DMOS 10D according to embodiment 1D has the following effect. That is, the capacity between the gate and the source and between the gate and the drain can be reduced, so that the high-speed switching characteristics can be further improved. This is because the electric field strength during reverse bias is eased in a vicinity of a region in which the P-type diffused region 138 is formed, so that it is possible to use a construction where in a region from the P-type diffused region 138 to the N⁺-type drain region 118, the polysilicon gate electrode 122 is provided opposite the N⁻-type epitaxial layer 110 with a thick field oxide film 136 in between.

Embodiment 1E

Figure 1E:
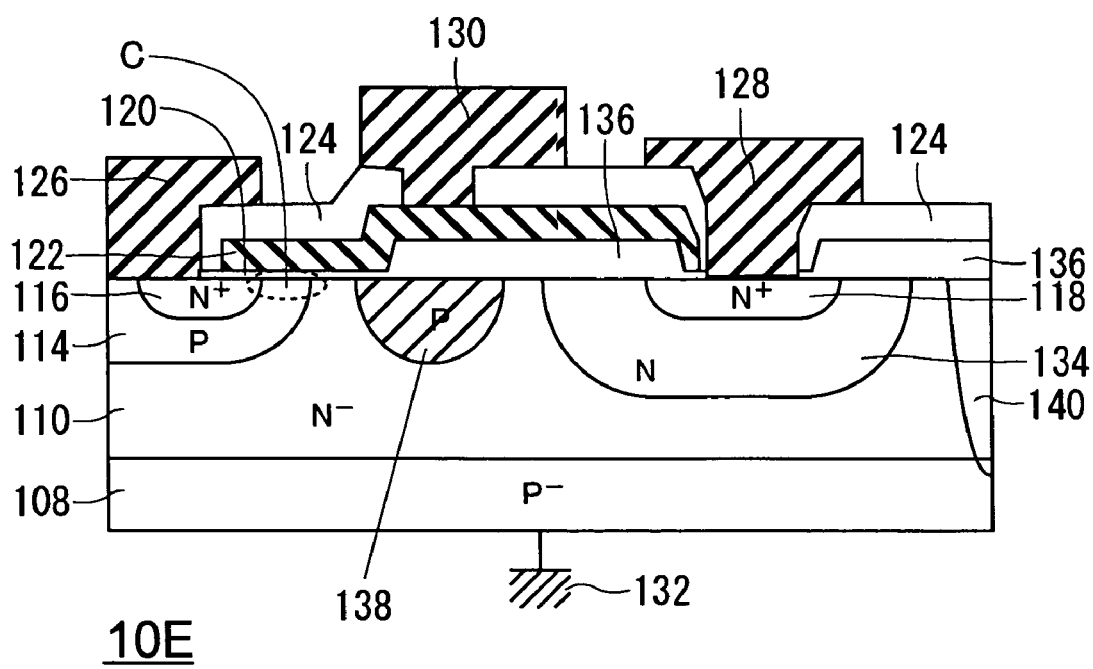
FIG. 1E is a cross-sectional view of a lateral short-channel DMOS according to embodiment 1E.

FIG. 1E is a cross-sectional view of a lateral short-channel DMOS according to embodiment 1E. A lateral short-channel DMOS 10E according to embodiment 1E has a similar construction to the lateral short-channel DMOS 10C according to embodiment 1C, with as shown in FIG. 1E, the difference being that in a region from the P-type diffused region 138 to the N⁺-type drain region 118, the polysilicon gate electrode 122 is provided opposite the N⁻-type epitaxial layer 110 with the field oxide film 136 in between.

This means that in addition to the effects of the lateral short-channel DMOS 10C according to embodiment 1C, the lateral short-channel DMOS 10E according to embodiment 1E has the following effect. That is, the capacity between the gate and the source and between the gate and the drain can be reduced, so that the high-speed switching characteristics can be further improved. This is because the electric field strength during reverse bias is eased in a vicinity of a region in which the P-type diffused region 138 is formed, so that it is possible to use a construction where in a region from the P-type diffused region 138 to the N⁺-type drain region 118, the polysilicon gate electrode 122 is provided opposite the N⁻-type epitaxial layer 110 with a thick field oxide film 136 in between.

Embodiment 2A

Figure 2A:
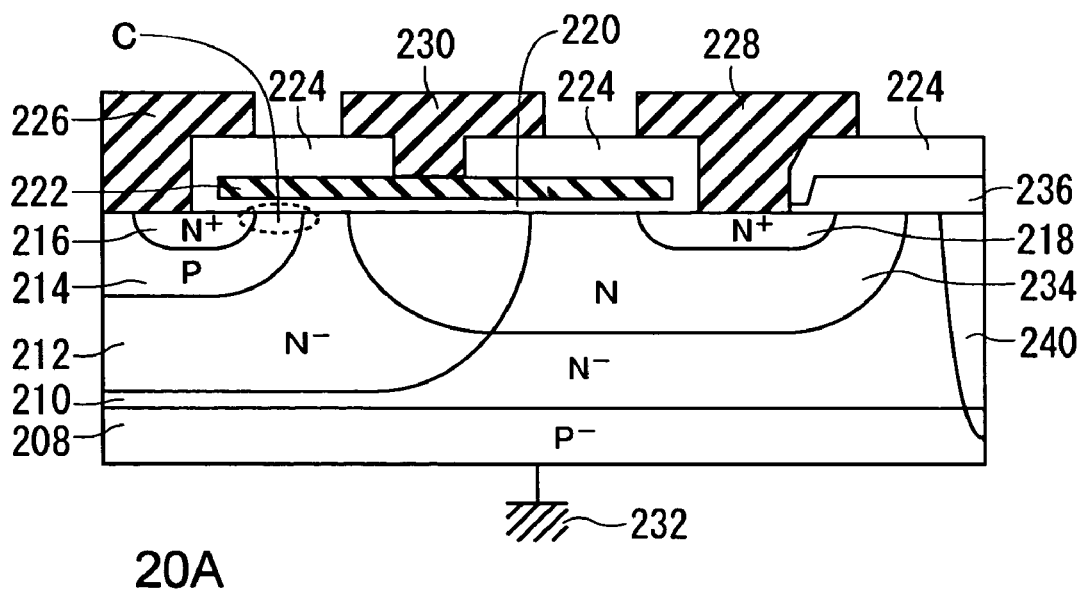
FIG. 2A is a cross-sectional view of a lateral short-channel DMOS according to embodiment 2A.

FIG. 2A is a cross-sectional view of a lateral short-channel DMOS according to embodiment 2A of the present invention. A lateral short-channel DMOS 20A according to this embodiment 2A is a lateral short-channel DMOS according to a second aspect of the present invention, and as shown in FIG. 2A, has an N⁻-type epitaxial layer (epitaxial layer) 210 formed on a surface of a P⁻-type semiconductor substrate (semiconductor substrate) 208, and an N⁻-type well (first conductivity-type well) 212 formed in a surface of the N⁻-type epitaxial layer 210. A P-type well (second conductivity-type well) 214 including a channel forming region C is formed in a surface of the N⁻-type well 212, and an N⁺-type source region (first conductivity-type source region) 216 is formed in a surface of the P-type well 214. On the other hand, an ON resistance lowering N-type well (first conductivity-type ON resistance lowering well) 234 is formed in a surface of the N⁻-type epitaxial layer 210 so as to not contact the P-type well 214, and an N⁺-type drain region (first conductivity-type drain region) 218 is formed in a surface of the ON resistance lowering N-type well 234.

A polysilicon gate electrode 222 is formed via a gate insulating film 220 in at least an upper part of the channel forming region C, out of a region from the N⁺-type source region 216 to the N⁺-type drain region 218. The polysilicon gate electrode 222 is connected to a gate resistance lowering metal layer 230. An element isolating region 240 is also formed on a right side of the N⁺-type drain region 218.

This means that according to the lateral short-channel DMOS 20A according to embodiment 2A, the ON resistance lowering N-type well 234 is formed in the surface of the N⁻-type epitaxial layer 210 so as to not contact the P-type well 214 and the N⁺-type drain region 218 is formed in the surface of the ON resistance lowering N-type well 234, so that when the DMOS 20A is ON, the ON resistance lowering N-type well 234 that has low resistance provides a large part of the current path from the N$^+$-type drain region 218 to the N$^+$-type source region 216 and the overall ON resistance can be sufficiently lowered even when the gate length is extended to lower the gate resistance. Accordingly, the lateral short-channel DMOS 20A according to embodiment 2A has a low gate resistance and a low ON resistance, as well as superior high-speed switching characteristics and superior current driving characteristics.

Also, according to the lateral short-channel DMOS 20A according to embodiment 2A, the ON resistance lowering N-type well 234 that includes a higher concentration of N-type dopant than the N$^-$-type well 212 is provided separately, so that the resistance when the DMOS 20A is ON can be lowered without increasing the concentration of dopant in the N$^-$-type well 212 and there is no worsening in the breakdown characteristics of the lateral short-channel DMOS.

Also, according to the lateral short-channel DMOS 20A according to embodiment 2A, the N$^-$-type well 212 is formed inside the N$^-$-type epitaxial layer 210, so that even in a semiconductor device where a lateral short-channel DMOS is integrated with other elements (such as a logic element), the breakdown characteristics of the lateral short-channel DMOS can be controlled according to the dopant concentration of the N$^-$-type well 212. As a result, it is possible to set the dopant concentration of the N$^-$-type epitaxial layer 210 at an appropriate concentration for other elements (such as a lower concentration than the N$^-$-type well 212), so that a semiconductor device with superior characteristics can be provided.

In the lateral short-channel DMOS 20A according to embodiment 2A, the depth of the N$^-$-type well 212 is 5 μm, for example, the depth of the P-type well 214 is 1.5 μm, for example, the depth of the N$^+$-type source region 216 is 0.3 μm, for example, the depth of the N$^+$-type drain region 218 is 0.3 μm, for example, and the depth of the ON resistance lowering N-type well 234 is 2 μm, for example.

In the lateral short-channel DMOS 20A according to embodiment 2A, the dopant concentration of the ON resistance lowering N-type well 234 is $1\times10^{+19}$ ions/cm$^3$, for example, the dopant concentration of the N$^-$-type epitaxial layer 210 is $5\times10^{+15}$ ions/cm$^3$, for example, and the dopant concentration of the N$^-$-type well 212 is $1\times10^{+16}$ ions/cm$^3$, for example.

Embodiment 2B

Figure 2B:
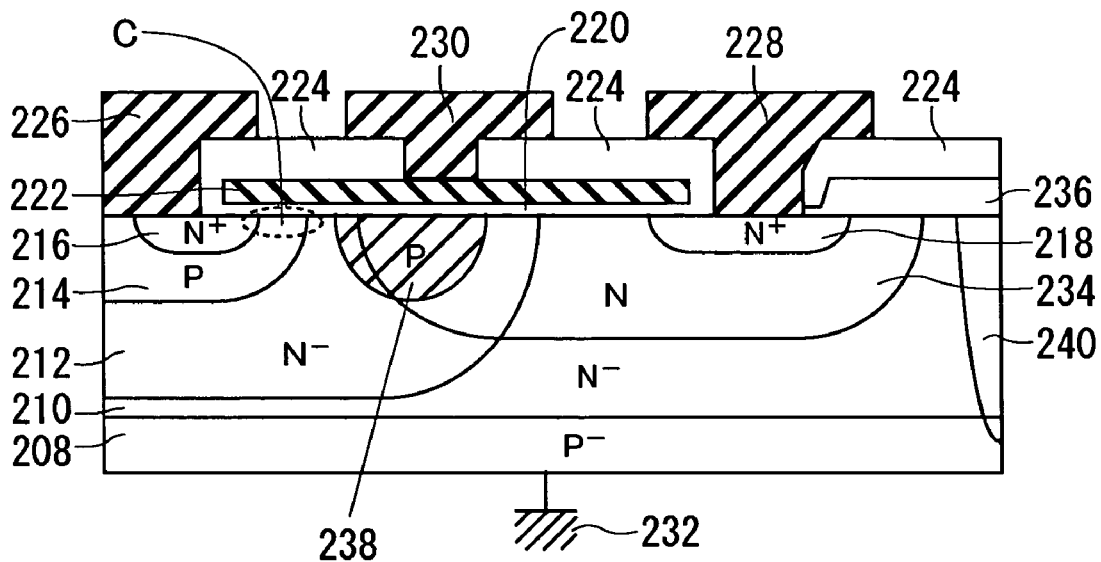
FIG. 2B is a cross-sectional view of a lateral short-channel DMOS according to embodiment 2B.

FIG. 2B is a cross-sectional view of a lateral short-channel DMOS according to embodiment 2B. A lateral short-channel DMOS 20B according to embodiment 2B has a similar structure to the lateral short-channel DMOS 20A according to embodiment 2A, with as shown in FIG. 2B, the difference being that a P-type diffused region (second conductivity-type diffused region) 238 is formed in a region between the P-type well 214 and the N$^+$-type drain region 218 in a surface of the N$^-$-type well 212 so as to not contact the P-type well 214.

According to the lateral short-channel DMOS 20B according to embodiment 2B, the following effect is obtained in addition to the effects of the lateral short-channel DMOS 20A according to embodiment 2A. That is, an electric field strength in a vicinity of the region in which the P-type diffused region 238 is formed is eased during application of reverse bias, so that the breakdown characteristics can be stabilized further.

It should be noted that when the DMOS 20B is ON, current from the N$^+$-type drain region 218 to the N$^+$-type source region 216 avoids the P-type diffused region 238 and flows in a deeper part (the N$^-$-type well 212) than the P-type diffused region 238, so that there is no increase in the ON resistance due to the provision of the P-type diffused region 238.

In the lateral short-channel DMOS 20B according to embodiment 2B, the dopant concentration of the P-type diffused region 238 is $3\times10^{+17}$ ions/cm$^3$, for example.

Embodiment 2C

Figure 2C:
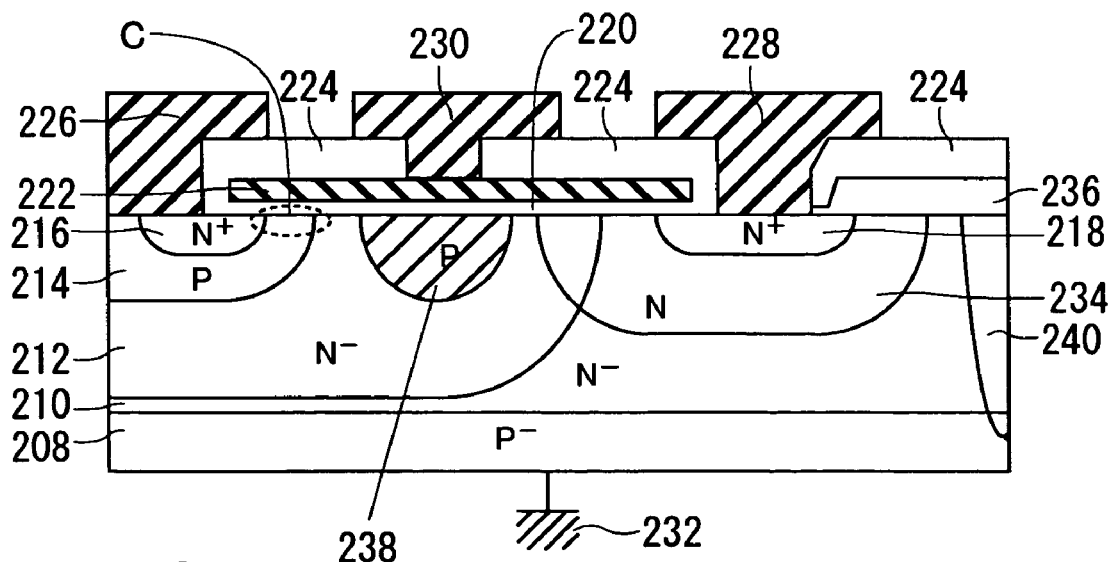
FIG. 2C is a cross-sectional view of a lateral short-channel DMOS according to embodiment 2C.

FIG. 2C is a cross-sectional view of a lateral short-channel DMOS according to embodiment 2C. A lateral short-channel DMOS 20C according to embodiment 2C has a similar construction to the lateral short-channel DMOS 20B according to embodiment 2B, with the difference being that the P-type diffused region 238 is formed so as to not contact the ON resistance lowering N-type well 234.

This means that in addition to the effects of the lateral short-channel DMOS 20B according to embodiment 2B, the lateral short-channel DMOS 20C according to embodiment 2C has the following effect. That is, since the P-type diffused region 238 that is not biased is constructed so as to not contact the ON resistance lowering N-type well 234, it is possible to thoroughly suppress a worsening of the breakdown characteristics and increases in leak currents.

Embodiment 2D

Figure 2D:
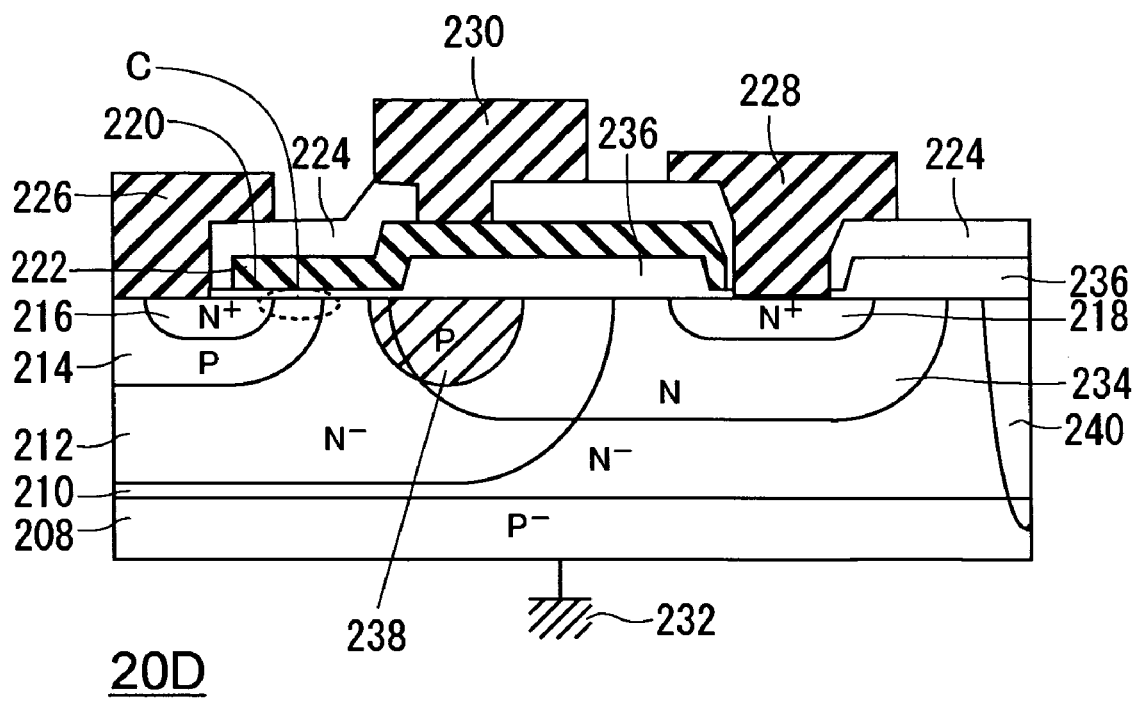
FIG. 2D is a cross-sectional view of a lateral short-channel DMOS according to embodiment 2D.

FIG. 2D is a cross-sectional view of a lateral short-channel DMOS according to embodiment 2D. A lateral short-channel DMOS 20D according to embodiment 2D has a similar construction to the lateral short-channel DMOS 20B according to embodiment 2B, with as shown in FIG. 2D, the difference being that in a region from the P-type diffused region 238 to the N$^+$-type drain region 218, the polysilicon gate electrode 222 is provided opposite the N$^-$-type epitaxial layer 210 with a field oxide film 236 in between.

This means that in addition to the effects of the lateral short-channel DMOS 20B according to embodiment 2B, the lateral short-channel DMOS 20D according to embodiment 2D has the following effect. That is, the capacity between the gate and the source and between the gate and the drain can be reduced, so that the high-speed switching characteristics can be improved. This is because the electric field strength during reverse bias is eased in a vicinity of a region in which the P-type diffused region 238 is formed, so that it is possible to use a construction where in a region from the P-type diffused region 238 to the N$^+$-type drain region 218, the polysilicon gate electrode 222 is provided opposite the N$^-$-type epitaxial layer 210 with a thick field oxide film 236 in between.

Embodiment 2E

Figure 2E:
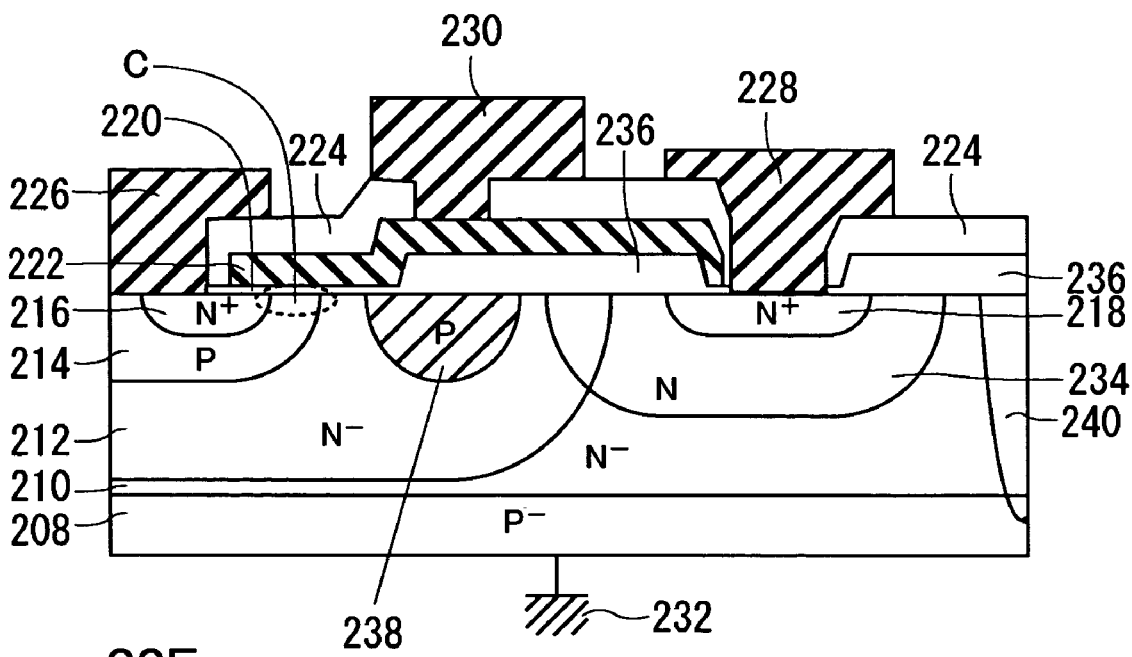
FIG. 2E is a cross-sectional view of a lateral short-channel DMOS according to embodiment 2E.

FIG. 2E is a cross-sectional view of a lateral short-channel DMOS according to embodiment 2E. A lateral short-channel DMOS 20E according to embodiment 2E has a similar construction to the lateral short-channel DMOS 20C according to embodiment 2C, with as shown in FIG. 2E, the difference being that in a region from the P-type diffused region 238 to the N$^+$-type drain region 218, the polysilicon gate electrode 222 is provided opposite the N$^-$-type epitaxial layer 210 with the field oxide film 236 in between.

This means that in addition to the effects of the lateral short-channel DMOS 20C according to embodiment 2C, the lateral short-channel DMOS 20E according to embodiment 2E has the following effect. That is, the capacity between the gate and the source and between the gate and the drain can be reduced, so that the high-speed switching characteristics can be further improved. This is because the electric field strength during reverse bias is eased in a vicinity of a region in which the P-type diffused region 238 is formed, so that it is possible to use a construction where in a region from the P-type diffused region 238 to the N⁺-type drain region 218, the polysilicon gate electrode 222 is provided opposite the N⁻-type epitaxial layer 210 with a thick field oxide film 236 in between.

Embodiment 2F

Figure 2F:
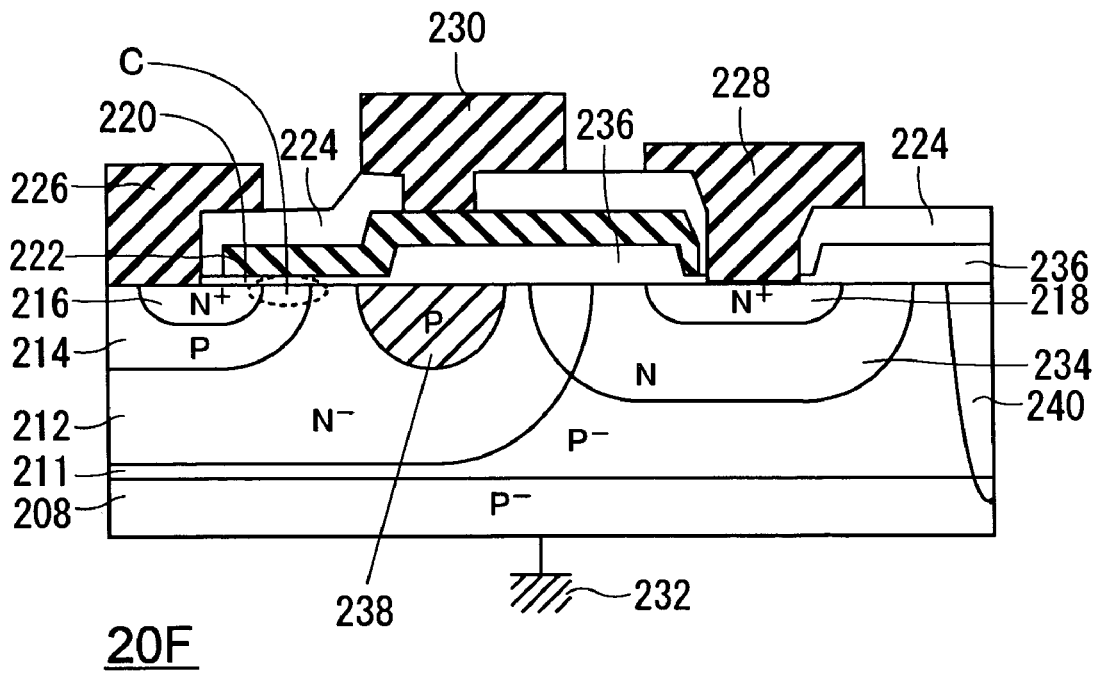
FIG. 2F is a cross-sectional view of a lateral short-channel DMOS according to embodiment 2F.

FIG. 2F is a cross-sectional view of a lateral short-channel DMOS according to embodiment 2F. A lateral short-channel DMOS 20F according to embodiment 2F has a similar construction to the lateral short-channel DMOS 20E according to embodiment 2E, with as shown in FIG. 2F, the difference being that a P⁻-type epitaxial layer 211, not the N⁻-type epitaxial layer 210, is formed on the surface of the P⁻-type semiconductor substrate 208.

In this way, according to the lateral short-channel DMOS 20F according to embodiment 2F, the P⁻-type epitaxial layer 211 is formed on the surface of the P⁻-type semiconductor substrate 208, but in the same way as the lateral short-channel DMOS 20E according to embodiment 2E, the N⁻-type well 212 is formed in the surface of the P⁻-type epitaxial layer 211, the P-type well 214 including the channel forming region C is formed in a surface of the N⁻-type well 212, and the N⁺-type source region 216 is formed in a surface of the P-type well 214. On the other hand, in the same way as the lateral short-channel DMOS 20E according to embodiment 2E, the ON resistance lowering N-type well 234 is formed in the surface of the P⁻-type epitaxial layer 211 so as to not contact the P-type well 214, and an N⁺-type drain region 218 is formed in a surface of the ON resistance lowering N-type well 234.

This means that the lateral short-channel DMOS 20F according to embodiment 2F has the same effect as the lateral short-channel DMOS 20E according to embodiment 2E.

Embodiment 3A

Figure 3A:
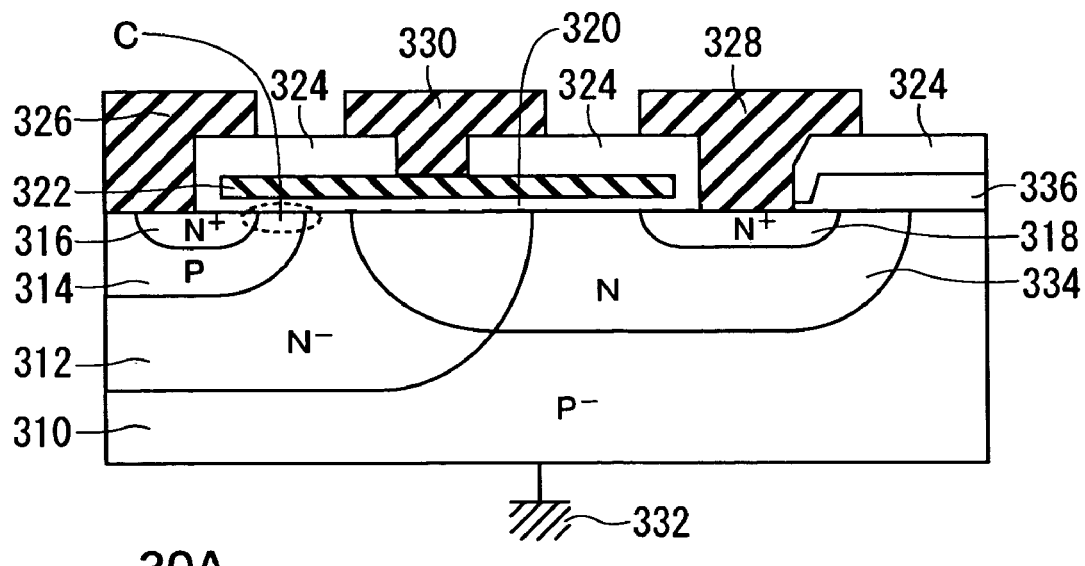
FIG. 3A is a cross-sectional view of a lateral short-channel DMOS according to embodiment 3A.

FIG. 3A is a cross-sectional view of a lateral short-channel DMOS according to embodiment 3A of the present invention. A lateral short-channel DMOS 30A according to this embodiment 3A is a lateral short-channel DMOS according to a third aspect of the present invention, and as shown in FIG. 3A, has an N⁻-type well (first conductivity-type well) 312 formed in a surface of a P⁻-type semiconductor substrate 310. A P-type well (second conductivity-type well) 314 including a channel forming region C is formed in a surface of the N⁻-type well 312, and an N⁺-type source region (first conductivity-type source region) 316 is formed in a surface of the P-type well 314. On the other hand, an ON resistance lowering N-type well (first conductivity-type ON resistance lowering well) 334 is formed in a surface of the P⁻-type semiconductor substrate 310 so as to contact the N⁻-type well 312 and to not contact the P-type well 314. An N⁺-type drain region (first conductivity-type drain region) 318 is formed in a surface of the ON resistance lowering N-type well 334.

A polysilicon gate electrode 322 is formed via a gate insulating film 320 in at least an upper part of the channel forming region C, out of a region from the N⁺-type source region 316 to the N⁺-type drain region 318, with the polysilicon gate electrode 322 being connected to a gate resistance lowering metal layer 330.

This means that according to the lateral short-channel DMOS 30A according to embodiment 3A, the ON resistance lowering N-type well 334 is formed in the surface of the P⁻-type semiconductor substrate 310 so as to contact the N⁻-type well 312 and to not contact the P-type well 314 and the N⁺-type drain region 318 is formed in the surface of the ON resistance lowering N-type well 334, so that when the DMOS 30A is ON, the ON resistance lowering N-type well 334 that has low resistance provides a large part of the current path from the N⁺-type drain region 318 to the N⁺-type source region 316 and the overall ON resistance can be sufficiently lowered even when the gate length is extended to lower the gate resistance. Accordingly, the lateral short-channel DMOS 30A according to embodiment 3A has a low gate resistance and a low ON resistance, as well as superior high-speed switching characteristics and superior current driving characteristics.

According to the lateral short-channel DMOS 30A according to embodiment 3A, the ON resistance lowering N-type well 334 that includes a higher concentration of N-type dopant than the N⁻-type well 312 is provided separately, so that the resistance when the DMOS 30A is ON can be lowered without increasing the concentration of dopant in the N⁻-type well 312 and there is no worsening in the breakdown characteristics of the lateral short-channel DMOS.

Also, according to the lateral short-channel DMOS 30A according to embodiment 3A, although the N⁻-type well 312 needs to be formed relatively deeply from the surface of the P⁻-type semiconductor substrate 310 in order to maintain the breakdown characteristics of the lateral short-channel DMOS, the ON resistance lowering N-type well 334 only needs to act as a current path from the N⁺-type drain region 318 to the N⁺-type source region 316 and so may be formed relatively shallowly from the surface of the P⁻-type semiconductor substrate 310. This means that little extension in the horizontal direction is required when forming the ON resistance lowering N-type well 334, and as a result, the element area of the lateral short-channel DMOS does not become particularly large.

In the lateral short-channel DMOS 30A according to embodiment 3A, the depth of the N⁻-type well 312 is 5 μm, for example, the depth of the P-type well 314 is 1.5 μm, for example, the depth of the N⁺-type source region 316 is 0.3 μm, for example, the depth of the N⁺-type drain region 318 is 0.3 μm, for example, and the depth of the ON resistance lowering N-type well 334 is 2 μm, for example.

Also, in the lateral short-channel DMOS 30A according to embodiment 3A, the dopant concentration of the ON resistance lowering N-type well 334 is $1 \times 10^{+19}$ ions/cm³, for example, and the dopant concentration of the N⁻-type well 312 is $1 \times 10^{+16}$ ions/cm³, for example.

Embodiment 3B

Figure 3B:
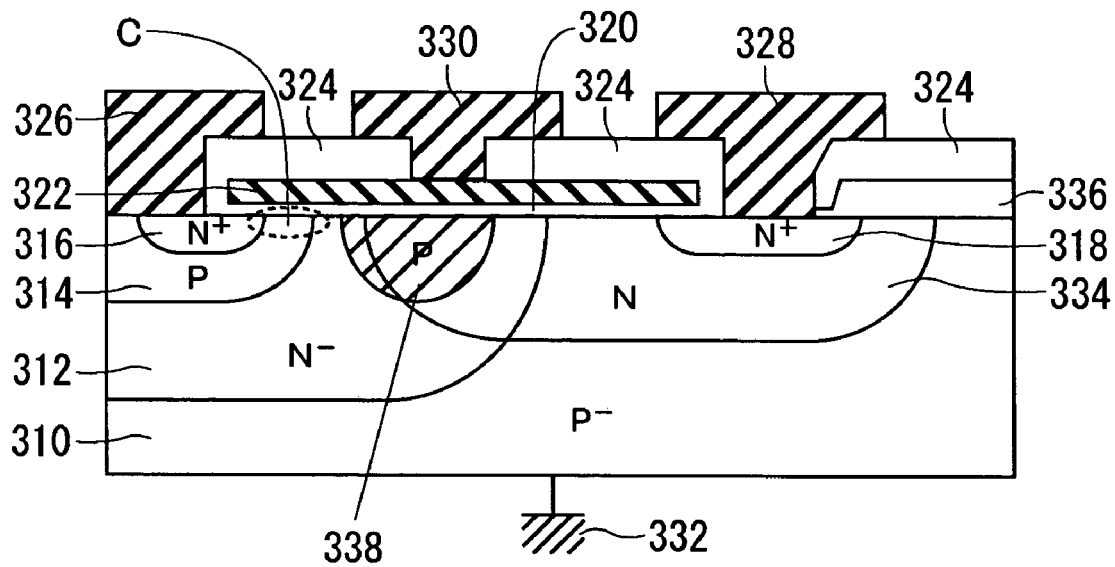
FIG. 3B is a cross-sectional view of a lateral short-channel DMOS according to embodiment 3B.

FIG. 3B is a cross-sectional view of a lateral short-channel DMOS according to embodiment 3B. A lateral short-channel DMOS 30B according to embodiment 3B has a similar structure to the lateral short-channel DMOS 30A according to embodiment 3A, with as shown in FIG. 3B, the difference being that a P-type diffused region (second conductivity-type diffused region) 338 is formed in a region between the P-type well 314 and the N⁺-type drain region 318 in a surface of the N⁻-type well 312 so as to not contact the P-type well 314.

According to the lateral short-channel DMOS 30B according to embodiment 3B, the following effect is obtained in addition to the effects of the lateral short-channel DMOS 30A according to embodiment 3A. That is, an electric field strength in a vicinity of the region in which the P-type diffused region 338 is formed is eased during reverse bias, so that the breakdown characteristics can be stabilized further.

It should be noted that when the DMOS 30B is ON, the current from the N$^+$-type drain region 318 to the N$^+$-type source region 316 avoids the P-type diffused region 338 and flows in a deeper part (the N$^-$-type well 312) than the P-type diffused region 338, so that there is no increase in the ON resistance.

Embodiment 3C

Figure 3C:
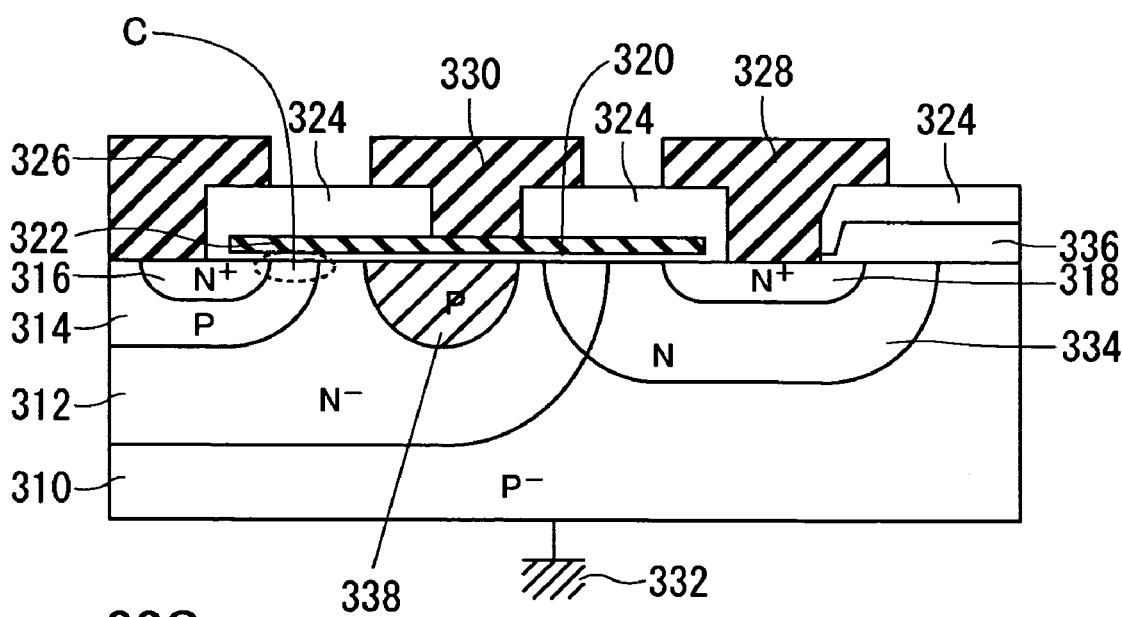
FIG. 3C is a cross-sectional view of a lateral short-channel DMOS according to embodiment 3C.

FIG. 3C is a cross-sectional view of a lateral short-channel DMOS according to embodiment 3C. A lateral short-channel DMOS 30C according to embodiment 3C has a similar construction to the lateral short-channel DMOS 30B according to embodiment 3B, with as shown in FIG. 3C, the difference being that the P-type diffused region 338 is formed so as to not contact the ON resistance lowering N-type well 334.

This means that in addition to the effects of the lateral short-channel DMOS 30B according to embodiment 3B, the lateral short-channel DMOS 30C according to embodiment 3C has the following effect. That is, since the P-type diffused region 338 that is not biased is constructed so as to not contact the ON resistance lowering N-type well 334, it is possible to thoroughly suppress a worsening of the breakdown characteristics and increases in leak currents.

Embodiment 3D

Figure 3D:
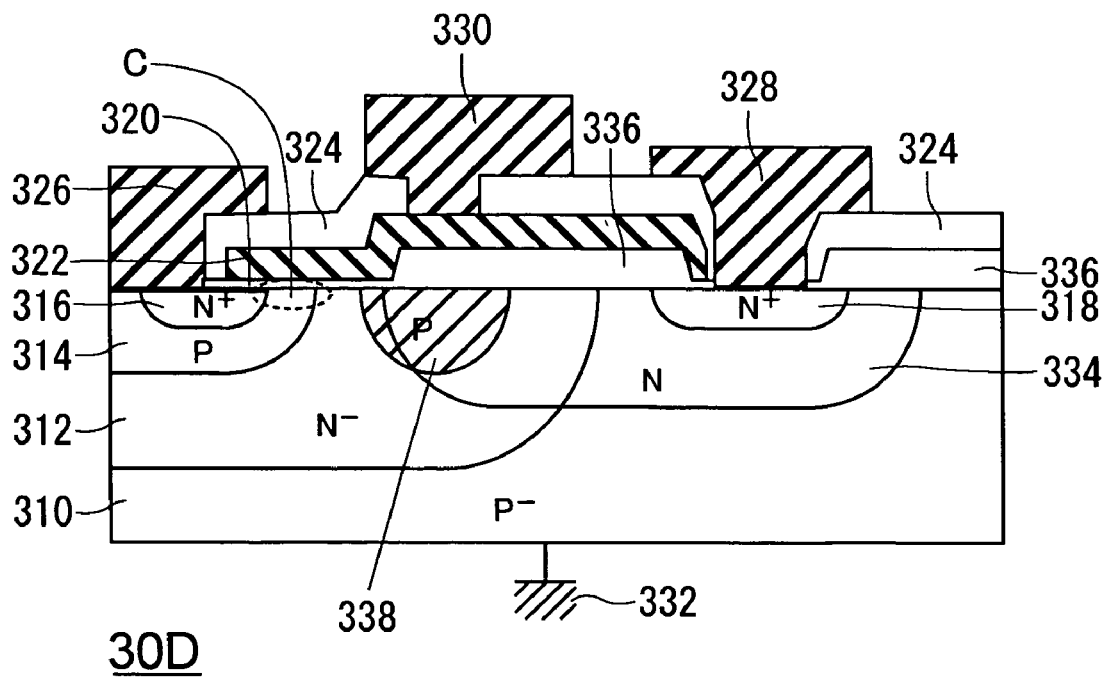
FIG. 3D is a cross-sectional view of a lateral short-channel DMOS according to embodiment 3D.

FIG. 3D is a cross-sectional view of a lateral short-channel DMOS according to embodiment 3D. A lateral short-channel DMOS 30D according to embodiment 3D has a similar construction to the lateral short-channel DMOS 30B according to embodiment 3B, with as shown in FIG. 3D, the difference being that in a region from the P-type diffused region 338 to the N$^+$-type drain region 318, the polysilicon gate electrode 322 is provided opposite the P$^-$-type semiconductor substrate 310 with a field oxide film 336 in between.

This means that in addition to the effects of the lateral short-channel DMOS 30B according to embodiment 3B, the lateral short-channel DMOS 30D according to embodiment 3D has the following effect. That is, the capacity between the gate and the source and between the gate and the drain can be reduced, so that the high-speed switching characteristics can be further improved. This is because the electric field strength during reverse bias is eased in a vicinity of a region in which the P-type diffused region 338 is formed, so that it is possible to use a construction where in a region from the P-type diffused region 338 to the N$^+$-type drain region 318, the polysilicon gate electrode 322 is provided opposite the P$^-$-type semiconductor substrate 310 with a thick field oxide film 336 in between.

Embodiment 3E

Figure 3E:
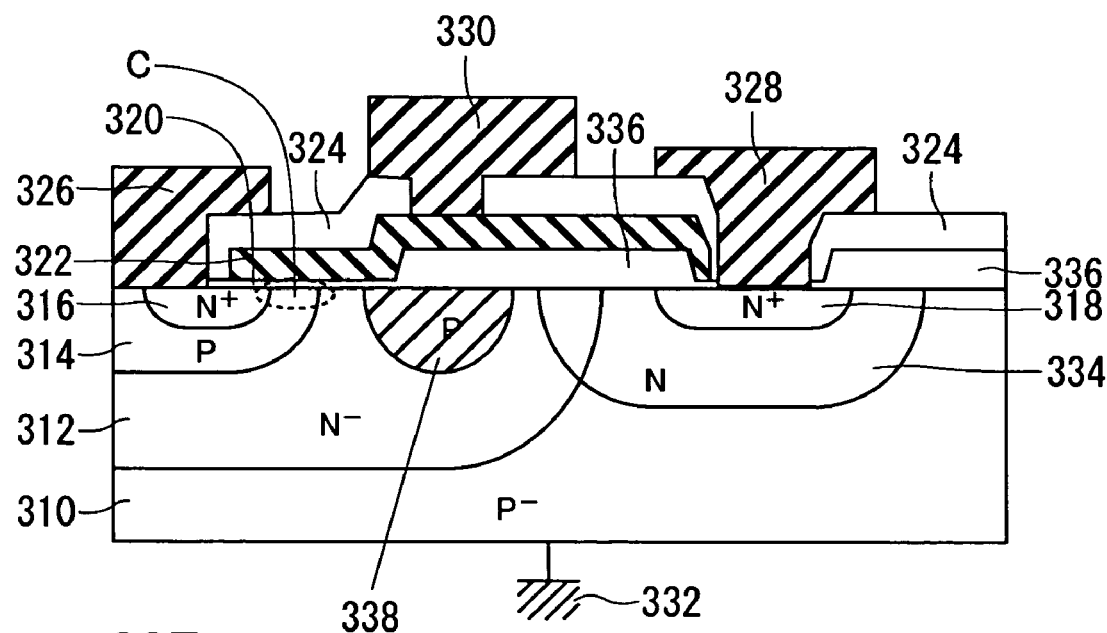
FIG. 3E is a cross-sectional view of a lateral short-channel DMOS according to embodiment 3E.

FIG. 3E is a cross-sectional view of a lateral short-channel DMOS according to embodiment 3E. A lateral short-channel DMOS 30E according to embodiment 3E has a similar construction to the lateral short-channel DMOS 30C according to the embodiment 3C, with as shown in FIG. 3E, the difference being that in a region from the P-type diffused region 338 to the N$^+$-type drain region 318, the polysilicon gate electrode 322 is provided opposite the P$^-$-type semiconductor substrate 310 with the field oxide film 336 in between.

This means that in addition to the effects of the lateral short-channel DMOS 30C according to embodiment 3C, the lateral short-channel DMOS 30E according to embodiment 3E has the following effect. That is, the capacity between the gate and the source and between the gate and the drain can be reduced, so that the high-speed switching characteristics can be further improved. This is because the electric field strength during reverse bias is eased in a vicinity of a region in which the P-type diffused region 338 is formed, so that it is possible to use a construction where in a region from the P-type diffused region 338 to the N$^+$-type drain region 318, the polysilicon gate electrode 322 is provided opposite the P$^-$-type semiconductor substrate 310 with a thick field oxide film 336 in between.

Figure 4A:
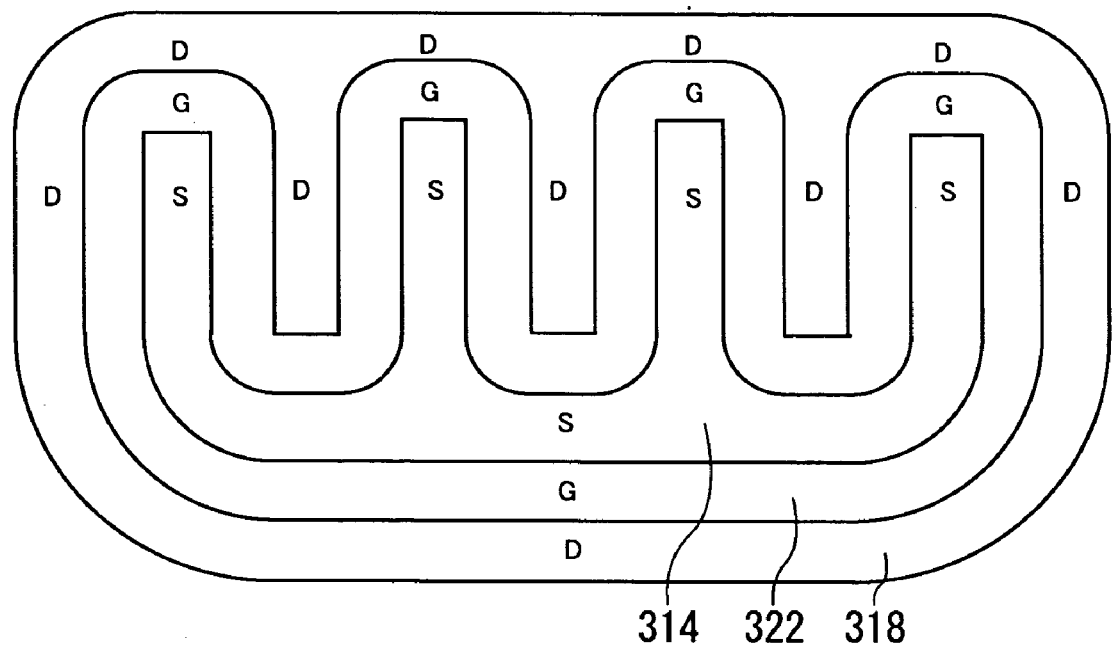
FIG. 4A is a plan view of a lateral short-channel DMOS according to embodiment 3D.
Figure 4B:
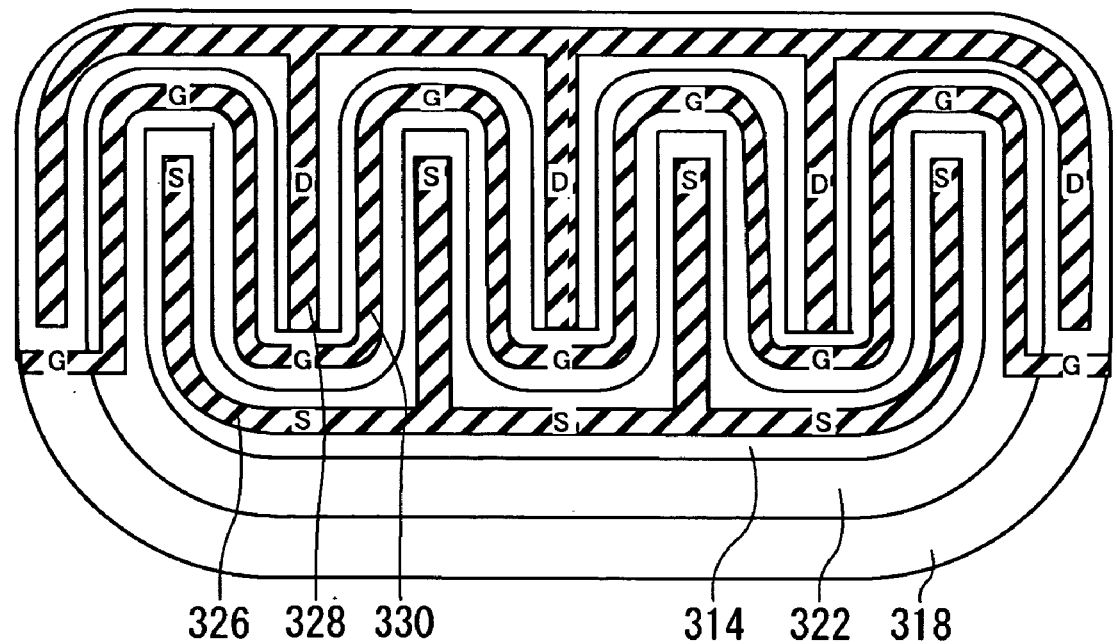
FIG. 4B is a plan view of a lateral short-channel DMOS according to embodiment 3D.

Lateral short-channel DMOS according to the present invention have been described above with embodiments 1A to 3E as examples, and next the surface layout of the lateral short-channel DMOS according to the present invention will be described with reference to FIGS. 4A and 4B. FIGS. 4A and 4B are plan views of the lateral short-channel DMOS 30D according to embodiment 3D. FIG. 4A is a plan view showing the polysilicon gate electrode 322 and a surface of the P$^-$-type semiconductor substrate. FIG. 4B is a plan view in which a source electrode 326, a drain electrode 328, and the gate resistance lowering metal layer 330 have been added to the structure shown in FIG. 4A. As shown in FIGS. 4A and 4B, the lateral short-channel DMOS 30D is constructed with the N$^+$-type source region 316 disposed in the center being surrounded by the N$^+$-type drain region 318 that is disposed in an outer periphery. The polysilicon gate electrode 322 is disposed between the N$^+$-type source region 316 and the N$^+$-type drain region 318. It should be noted that the symbol "S" in FIG. 4A represents a P-type well. Also, the ON resistance lowering N-type well 334 and the P-type diffused region 338 have been omitted from FIGS. 4A and 4B.

Figure 5:
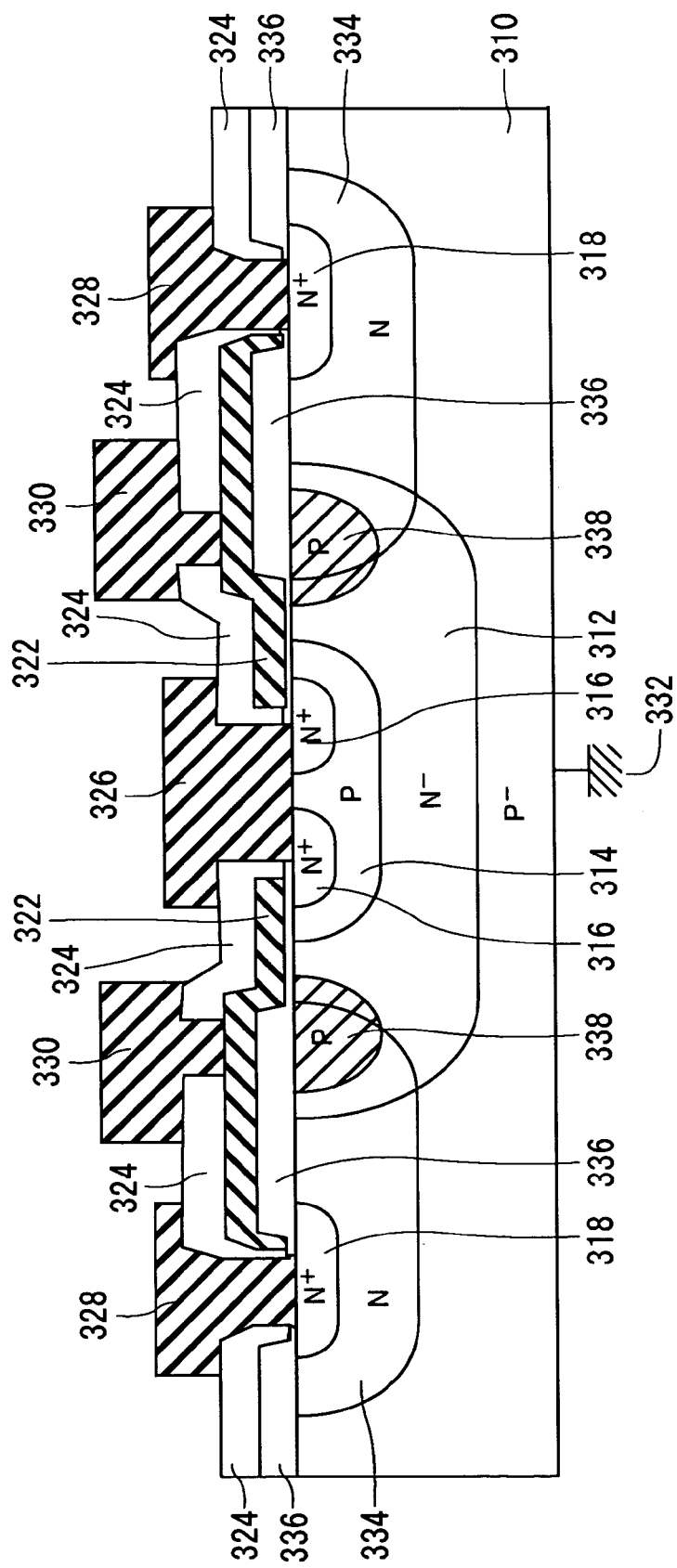
FIG. 5 is a cross-sectional view of a lateral short-channel DMOS according to embodiment 3D.

FIG. 5 is a cross-sectional view of the lateral short-channel DMOS 30D according to embodiment 3D. In this drawing, a wider region is shown than in FIG. 3D. As shown in FIG. 5, the lateral short-channel DMOS 30D is constructed so as to be surrounded by the N$^+$-type drain region 318 disposed in an outer periphery thereof with the polysilicon gate electrode 322 disposed inside the N$^+$-type drain region 318 and the N$^+$-type source region 316 disposed inside the polysilicon gate electrode 322. This means that as shown in FIGS. 4 and 5, the lateral short-channel DMOS 30D is a lateral short-channel DMOS with a large gate width and superior current driving characteristics.

Figure 6:
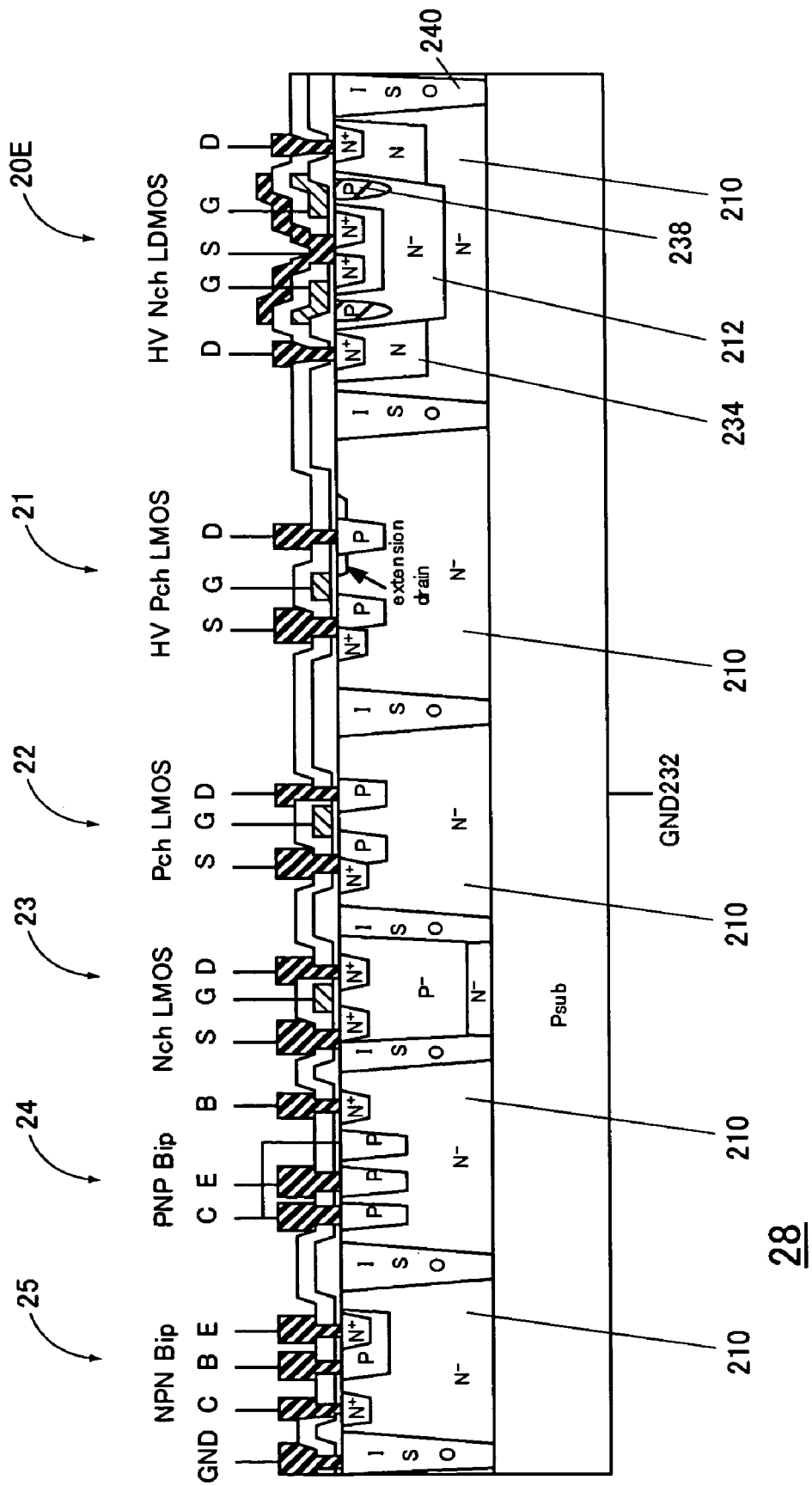
FIG. 6 is a cross-sectional view of a semiconductor device in which a lateral short-channel DMOS according to embodiment 2E has been integrated with other elements.
Figure 7A:
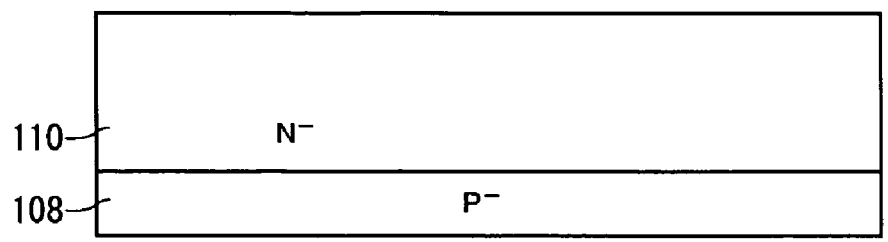
FIGS. 7a to 7f are diagrams showing manufacturing processes for a lateral short-channel DMOS according to embodiment 4.
Figure 7B:
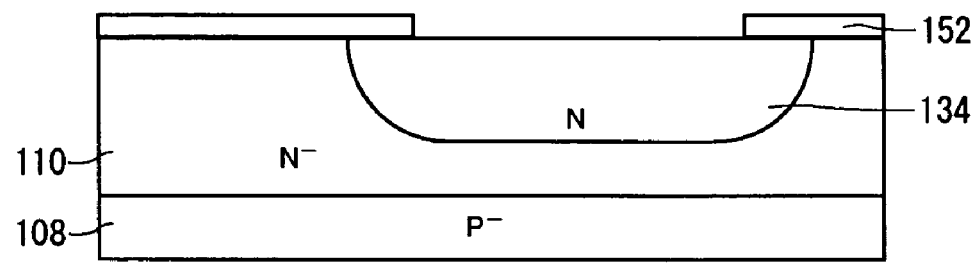
Figure 7C:
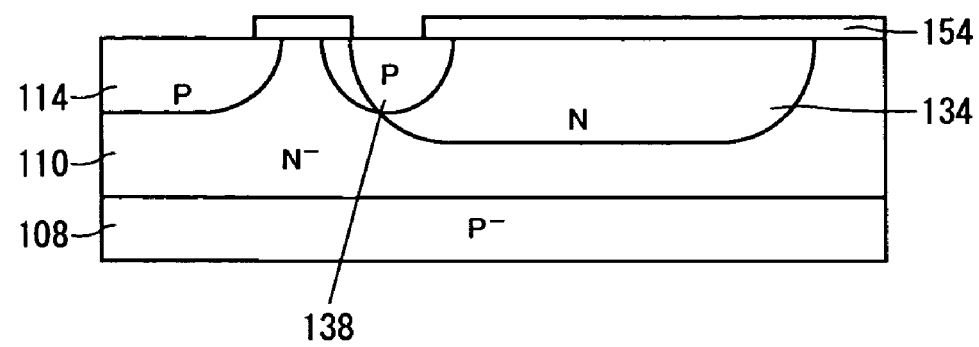
Figure 7D:
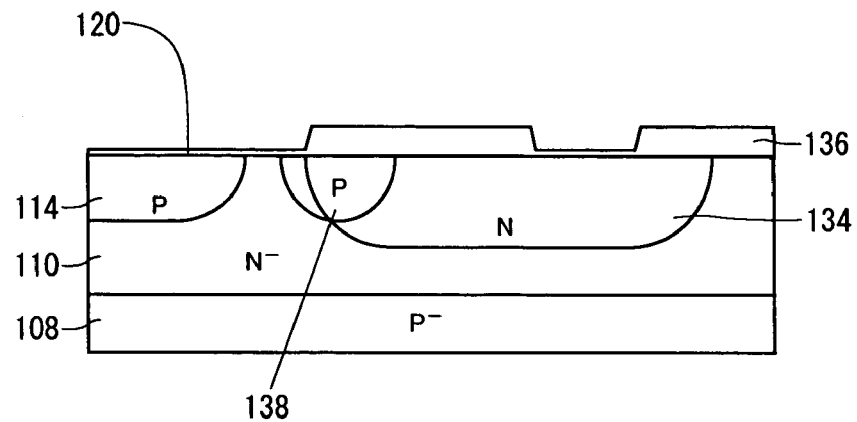
Figure 7E:
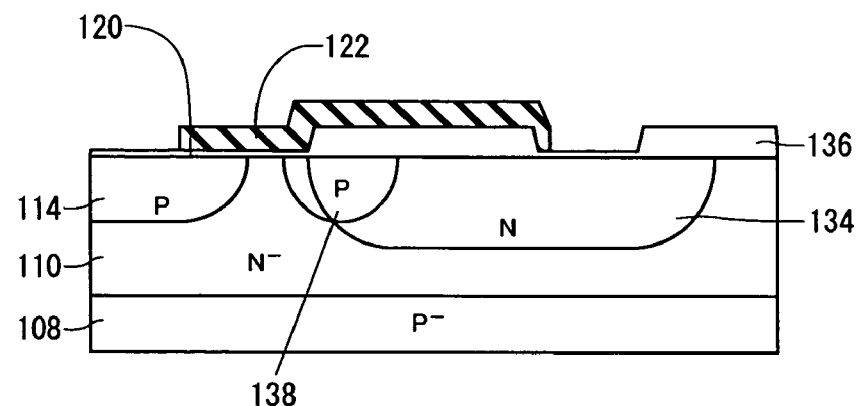
Figure 7F:
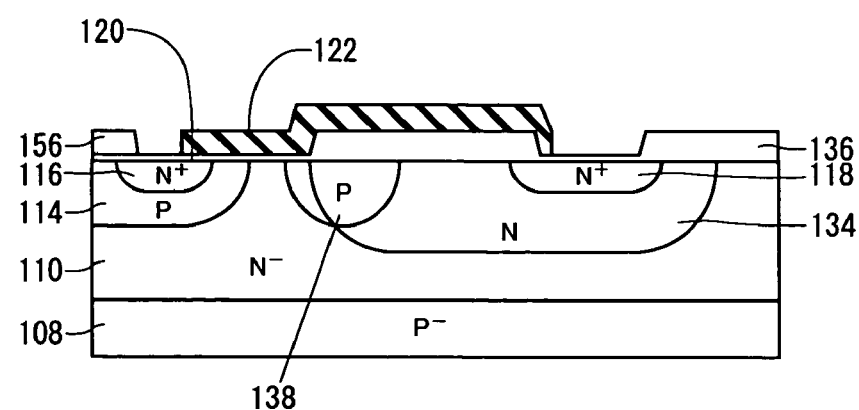
Figure 8A:
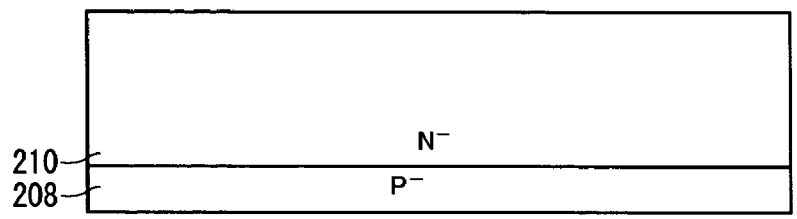
FIGS. 8a to 8g are diagrams showing manufacturing processes for a lateral short-channel DMOS according to embodiment 5.
Figure 8B:
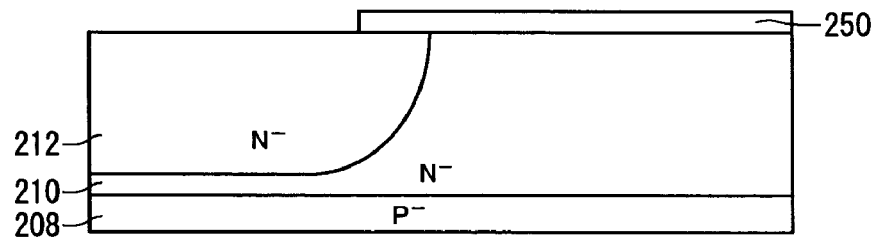
Figure 8C:
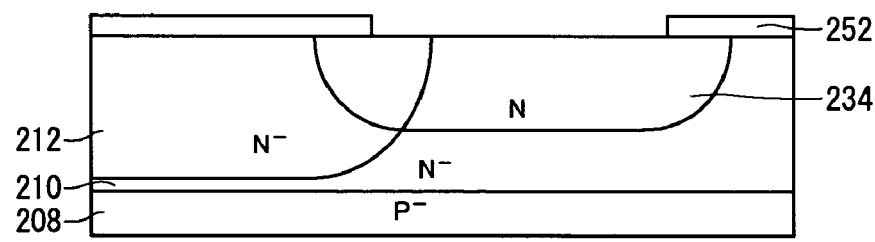
Figure 8D:
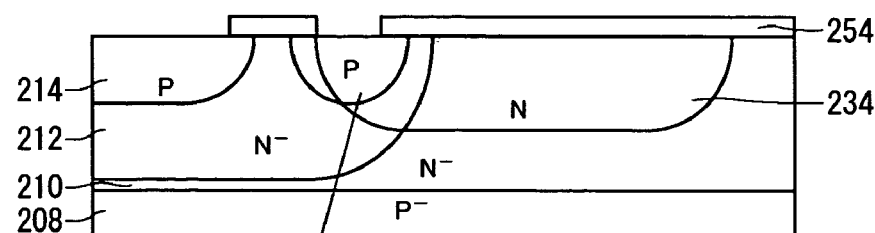
Figure 8E:
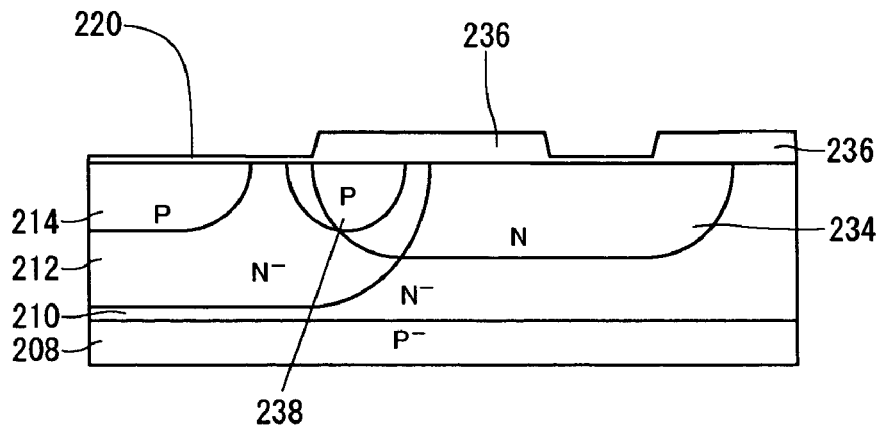
Figure 8F:
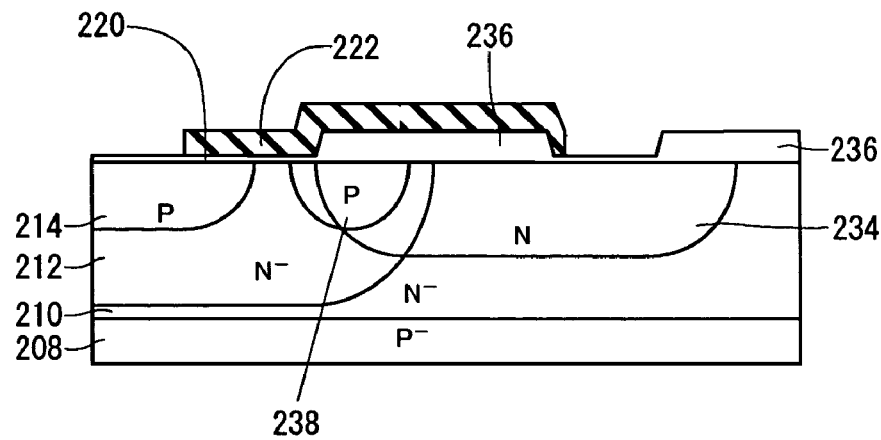
Figure 8G:
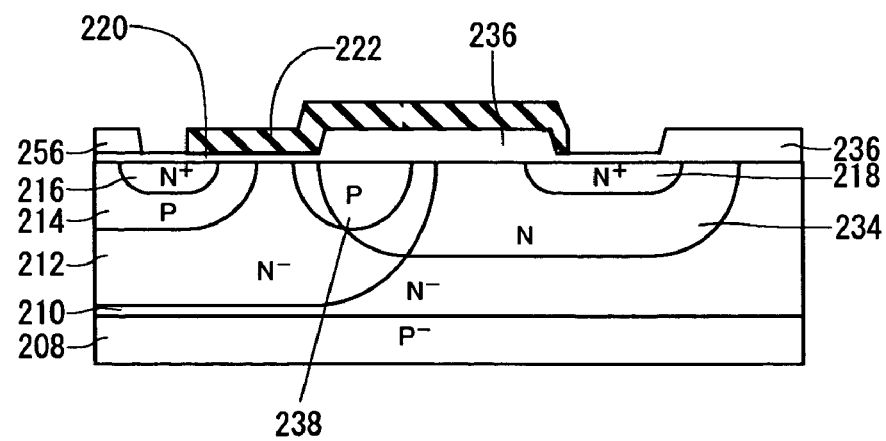
Figure 9A:
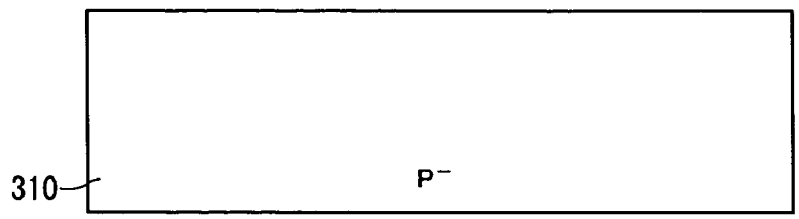
FIGS. 9a to 9g are diagrams showing manufacturing processes for a lateral short-channel DMOS according to embodiment 6.
Figure 9B:
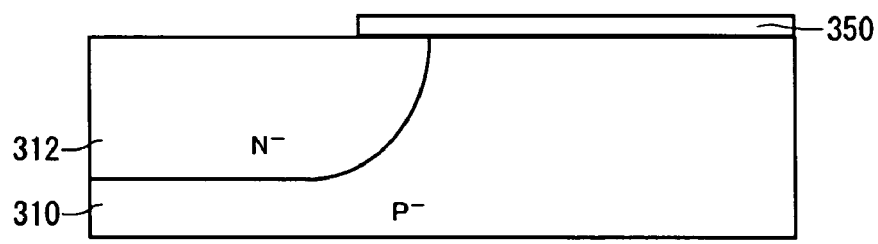
Figure 9C:
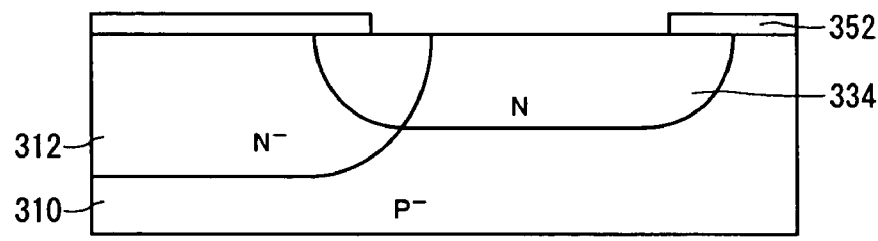
Figure 9D:
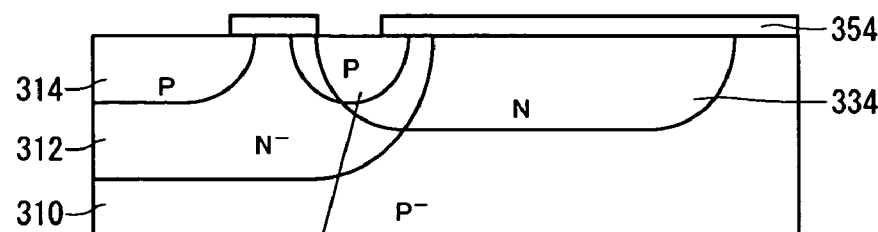
Figure 9E:
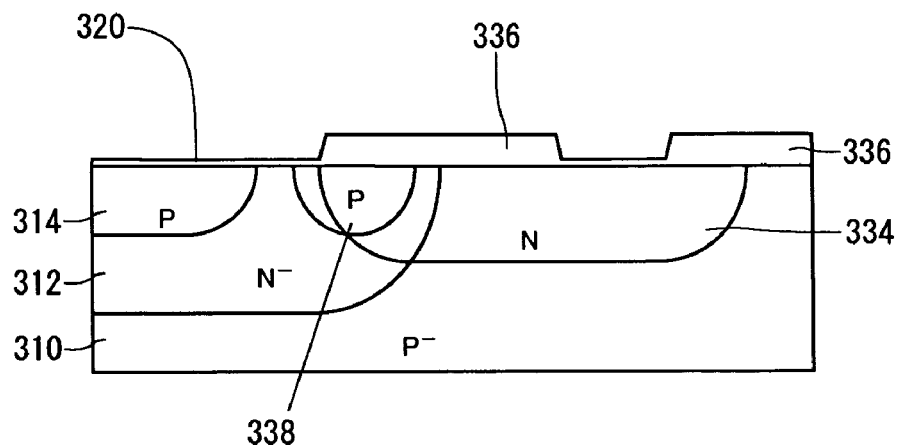
Figure 9F:
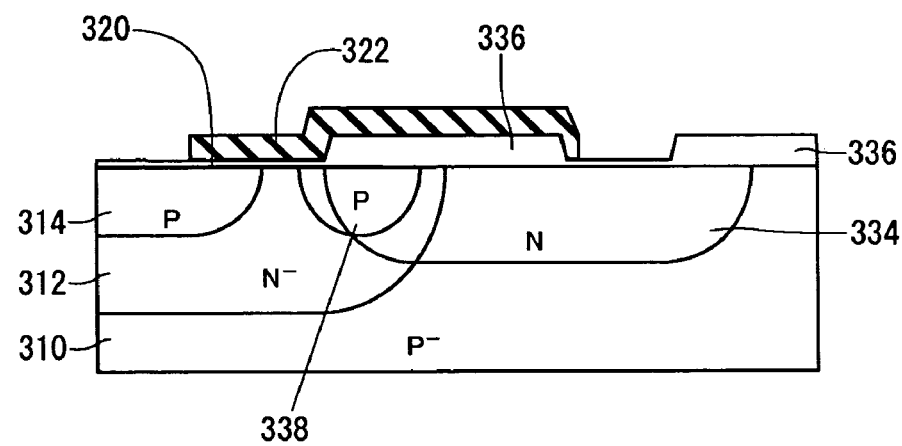
Figure 9G:
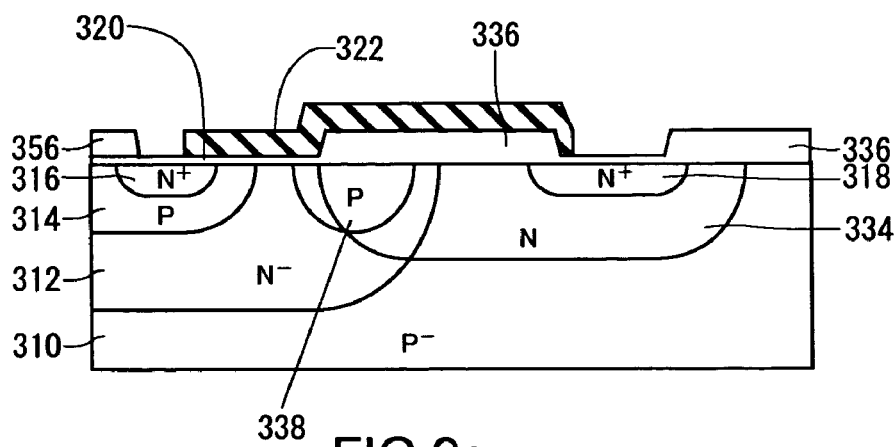

Next, an example of where the lateral short-channel DMOS according to the present invention is integrated with other elements will be described with reference to FIG. 6. FIG. 6 is a cross-sectional view of a semiconductor device in which the lateral short-channel DMOS 20E is integrated with other elements. As shown in FIG. 6, this semiconductor device 28 includes the N-channel lateral short-channel DMOS 20E, a P-channel MOS transistor 21, an N-channel MOS transistor 23, a P-channel MOS transistor 22, an NPN bipolar transistor 25, and a PNP bipolar transistor 24. These respective other elements are formed inside an N$^-$-type epitaxial layer 210 formed on the surface of a P$^-$-type semiconductor substrate.

In the lateral short-channel DMOS 20E, the N$^-$-type well 212 is formed inside the N$^-$-type epitaxial layer 210, and the P-type well and the N$^+$-type source region is formed in this N$^-$-type well. This means that according to the semiconductor device 28, it is possible to control the breakdown characteristics of the lateral short-channel DMOS 20E via the dopant concentration of the N$^-$-type well 212. As a result, the dopant concentration of the N$^-$-type epitaxial layer 210 can be set at an appropriate concentration (for example, a lower concentration than the N⁻-type well 212) for the other elements (for example, the N-channel MOS transistor 23 and the P-channel MOS transistor 22), so that a semiconductor device with superior characteristics can be provided.

Embodiment 4

FIGS. 7a to 7f are diagrams showing manufacturing processes during a method of manufacturing a lateral short-channel DMOS according to embodiment 4. The method of manufacturing a lateral short-channel DMOS according to embodiment 4 is a method of manufacturing the lateral short-channel DMOS 10D according to embodiment 1D. This method of manufacturing a lateral short-channel DMOS according to embodiment 4 will be described with reference to FIGS. 7a to 7f.

As shown in FIGS. 7a to 7f, the method of manufacturing a lateral short-channel DMOS according to embodiment 4 includes the first process (a) to the sixth process (f) described below.

(a) First Process

A semiconductor substrate where the N⁻-type epitaxial layer 110 is formed on a surface of a semiconductor substrate 108 composed of a P⁻-type silicon substrate is prepared. The dopant concentration of the epitaxial layer 110 is set at $1 \times 10^{+16}$ ions/cm³, for example.

(b) Second Process

Next, a first ion implanting mask 152 with a predetermined opening is formed on a surface of the N⁻-type epitaxial layer 110 and phosphorous ions, for example, are implanted as an N-type dopant with the first ion implanting mask 152 as a mask to form the ON resistance lowering N-type well 134. Here, the dopant concentration is $1 \times 10^{+19}$ ions/cm³, for example.

(c) Third Process

Next, after the first ion implanting mask 152 has been removed, a second ion implanting mask 154 with a predetermined opening is formed on the surface of the N⁻-type epitaxial layer 110 and boron ions, for example, are implanted as a P-type dopant with the second ion implanting mask 154 as a mask to form the P-type well 114 that does not contact the ON resistance lowering N-type well 134 and also form the P-type diffused region 138 in a region of the ON resistance lowering N-type well 134 that is opposite the P-type well 114. Here, the dopant concentration is $3 \times 10^{+17}$ ions/cm³, for example. It should be noted that it is also possible to form the P-type well 114 and the P-type diffused region 138 in separate steps.

(d) Fourth Process

Next, after the second ion implanting mask 154 has been removed, the field oxide film 136 that includes a predetermined opening is formed on the surface of the N⁻-type epitaxial layer 110, and the gate insulating film 120 is formed by thermal oxidation at the opening of the field oxide film 136.

(e) Fifth Process

Next, the polysilicon gate electrode 122 is formed in a predetermined region on upper surfaces of the gate insulating film 120 and the field oxide film 136.

(f) Sixth Process

Next, after a resist 156 has been formed, the resist 156, the polysilicon gate electrode 122, and the field oxide film 136 are used as a mask and arsenic ions, for example, are implanted as an N-type dopant to form the N⁺-type source region 116 and the N⁺-type drain region 118.

After this, the implanted dopant is activated, and then an interlayer dielectric 124 is formed. Next, after a predetermined contact hole has been opened in the interlayer dielectric 124, a metal layer is formed. After this, the metal layer is patterned to form a source electrode 126, a drain electrode 128, and the gate resistance lowering metal layer 130. Next, the semiconductor substrate 108 is connected to ground 132, thereby completing the lateral short-channel DMOS 10D.

As shown above, according to the method of manufacturing a lateral short-channel DMOS according to embodiment 4, it is possible to manufacture the superior lateral short-channel DMOS 10D according to embodiment 1D using a relatively simple method.

It should be noted that when manufacturing the lateral short-channel DMOS 10B according to embodiment 1B, in the fourth process (d) of the above method of manufacturing, the field oxide film 136 may be opened in a region from the P-type diffused region 138 to the N⁺-type drain region 118 (the region that will become the N⁺-type drain region 118).

Also, when manufacturing the lateral short-channel DMOS 10A according to embodiment 1A, in the third process (c) of the above method of manufacturing, a mask with a part that is not open corresponding to the P-type diffused region 138 may be used as the second ion implanting mask 154.

Also, when manufacturing the lateral short-channel DMOS 10E according to embodiment 1E, in the second and third processes (b) and (c) of the above method of manufacturing, the P-type diffused region 138 may be formed so as to not contact the ON resistance lowering N-type well 134.

Also, when manufacturing the lateral short-channel DMOS 10C according to embodiment 1C, in the second and third processes (b) and (c) of the above method of manufacturing, the P-type diffused region 138 may be formed so as to not contact the ON resistance lowering N-type well 134, and in the fourth process (d) the field oxide film 136 may be opened in a region from the P-type diffused region 138 to the N⁺-type drain region 118.

Embodiment 5

FIGS. 8a to 8g are diagrams showing manufacturing processes during a method of manufacturing a lateral short-channel DMOS according to embodiment 5. The method of manufacturing a lateral short-channel DMOS according to embodiment 5 is a method of manufacturing the lateral short-channel DMOS 20D according to embodiment 2D. This method of manufacturing a lateral short-channel DMOS according to embodiment 5 will now be described with reference to FIGS. 8a to 8g.

As shown in FIGS. 8a to 8g, the method of manufacturing a lateral short-channel DMOS according to embodiment 5 includes the first process (a) to the seventh process (g) described below.

(a) First Process

A semiconductor substrate where the N⁻-type epitaxial layer 210 is formed on a surface of a semiconductor substrate 208 composed of a P⁻-type silicon substrate is prepared. The dopant concentration of the N⁻-type epitaxial layer 210 is set at $5 \times 10^{+15}$ ions/cm³, for example.

(b) Second Process

Next, a first ion implanting mask 250 with a predetermined opening is formed on a surface of the N⁻-type epitaxial layer 210 and phosphorous ions, for example, are implanted as an N-type dopant with the first ion implanting mask 250 as a mask to form the N⁻-type well 212. Here, the dopant concentration is 1×10⁺¹⁶ ions/cm³, for example.

(c) Third Process

Next, after the first ion implanting mask 250 has been removed, a second ion implanting mask 252 with a predetermined opening is formed on the surface of the N⁻-type epitaxial layer 210 and phosphorus ions, for example, are implanted at a higher concentration than in the second process as an N-type dopant with the second ion implanting mask 252 as a mask to form the ON resistance lowering N-type well 234 that contact the N⁻-type well 212. Here, the dopant concentration is 1×10⁺¹⁹ ions/cm³, for example.

(d) Fourth Process

Next, after the second ion implanting mask 252 has been removed, a third ion implanting mask 254 with a predetermined opening is formed on the surface of the N⁻-type epitaxial layer 210 and boron ions, for example, are implanted as a P-type dopant with the third ion implanting mask 254 as a mask to form the P-type well 214 that does not contact the ON resistance lowering N-type well 234 and also form the P-type diffused region 238 in a region of the ON resistance lowering N-type well 234 that is opposite the P-type well 214. Here, the dopant concentration is 3×10⁺¹⁷ ions/cm³, for example. It should be noted that it is also possible to form the P-type well 214 and the P-type diffused region 238 in separate steps.

(e) Fifth Process

Next, after the third ion implanting mask 254 has been removed, the field oxide film 236 with a predetermined opening is formed on the surface of the N⁻-type epitaxial layer 210, and the gate insulating film 220 is formed by thermal oxidization at the opening of the field oxide film 236.

(f) Sixth Process

Next, the polysilicon gate electrode 222 is formed in a predetermined region on upper surfaces of the gate insulating film 220 and the field oxide film 236.

(g) Seventh Process

Next, after a resist 256 has been formed, the resist 256, the polysilicon gate electrode 222, and the field oxide film 236 are used as a mask and arsenic ions, for example, are implanted as an N-type dopant to form the N⁺-type source region 216 and the N⁺-type drain region 218.

After this, the implanted dopant is activated, and then an interlayer dielectric 224 is formed. Next, after a predetermined contact hole has been opened in the interlayer dielectric 224, a metal layer is formed. After this, the metal layer is patterned to form a source electrode 226, a drain electrode 228, and the gate resistance lowering metal layer 230. Next, the semiconductor substrate 208 is connected to ground 232, thereby completing the lateral short-channel DMOS 20D.

As shown above, according to the method of manufacturing a lateral short-channel DMOS according to embodiment 5, it is possible to manufacture the superior lateral short-channel DMOS 20D according to embodiment 2D using a relatively simple method.

It should be noted that when manufacturing the lateral short-channel DMOS 20B according to embodiment 2B, in the fifth process (e) of the above method of manufacturing, the field oxide film 236 may be opened in a region from the P-type diffused region 238 to the N⁺-type drain region 218 (the region that will become the N⁺-type drain region 218).

Also, when manufacturing the lateral short-channel DMOS 20A according to embodiment 2A, in the fourth process (d) of the above method of manufacturing, a mask with a part that is not open corresponding to the P-type diffused region 238 may be used as the third ion implanting mask 254.

Also, when manufacturing the lateral short-channel DMOS 20E according to embodiment 2E, in the third and fourth processes (c) and (d) of the above method of manufacturing, the P-type diffused region 238 may be formed so as to not contact the ON resistance lowering N-type well 234.

Also, when manufacturing the lateral short-channel DMOS 20C according to embodiment 2C, in the third and fourth processes (c) and (d) of the above method of manufacturing, the P-type diffused region 238 may be formed so as to not contact the ON resistance lowering N-type well 234, and in the fifth process (e) the field oxide film 236 may be opened in a region from the P-type diffused region 238 to the N⁺-type drain region 218.

Also, when manufacturing the lateral short-channel DMOS 20F according to embodiment 2F, in the first process of the above method of manufacturing, a semiconductor substrate where the P⁻-type epitaxial layer 211 is formed on a surface of a semiconductor substrate 208 composed of a P⁻-type silicon substrate may be prepared. A substrate with a dopant concentration of 5×10⁺¹⁵ ions/cm³, for example, is used as the P⁻-type epitaxial layer 211.

Embodiment 6

FIGS. 9a to 9g are diagrams showing manufacturing processes during a method of manufacturing a lateral short-channel DMOS according to embodiment 6. The method of manufacturing a lateral short-channel DMOS according to embodiment 6 is a method of manufacturing the lateral short-channel DMOS 30D according to embodiment 3D. This method of manufacturing a lateral short-channel DMOS according to embodiment 6 will now be described with reference to FIGS. 9a to 9g.

As shown in FIGS. 9a to 9g, the method of manufacturing a lateral short-channel DMOS according to embodiment 6 includes the first process (a) to the seventh process (g) described below.

(a) First Process

A semiconductor substrate 310 composed of a P⁻-type silicon substrate is prepared.

(b) Second Process

Next, a first ion implanting mask 350 with a predetermined opening is formed on a surface of this semiconductor substrate 310 and phosphorous ions, for example, are implanted as an N-type dopant with the first ion implanting mask 350 as a mask to form the N⁻-type well 312. Here, the dopant concentration is 1×10⁺¹⁶ ions/cm³, for example.

(c) Third Process

Next, after the first ion implanting mask 350 has been removed, a second ion implanting mask 352 with a predetermined opening is formed on one surface of the semiconductor substrate 310 and phosphorus ions, for example, are implanted at a higher concentration than in the second process as an N-type dopant with the second ion implanting mask 352 as a mask to form the ON resistance lowering N-type well 334 that contact the N⁻-type well 312. Here, the dopant concentration is 1×10⁺¹⁹ ions/cm³, for example.

(d) Fourth Process

Next, after the second ion implanting mask 352 has been removed, a third ion implanting mask 354 with a predetermined opening is formed on one surface of the semiconductor substrate 310 and boron ions, for example, are implanted as a P-type dopant with the third ion implanting mask 354 as a mask to form the P-type well 314 that does not contact the ON resistance lowering N-type well 334 and also form the P-type diffused region 338 in a region of the ON resistance lowering N-type well 334 that is opposite the P-type well 314. Here, the dopant concentration is $3 \times 10^{+17}$ ions/cm$^3$, for example. It should be noted that it is also possible to form the P-type well 314 and the P-type diffused region 338 in separate steps.

(e) Fifth Process

Next, after the third ion implanting mask 354 has been removed, the field oxide film 336 with a predetermined opening is formed on one surface of the semiconductor substrate 310, and the gate insulating film 320 is formed by thermal oxidization at the opening of the field oxide film 336.

(f) Sixth Process

Next, the polysilicon gate electrode 322 is formed in a predetermined region on upper surfaces of the gate insulating film 320 and the field oxide film 336.

(g) Seventh Process

Next, after a resist 356 has been formed, the resist 356, the polysilicon gate electrode 322, and the field oxide film 336 are used as a mask and arsenic ions, for example, are implanted as an N-type dopant to form the N$^+$-type source region 316 and the N$^+$-type drain region 318.

After this, the implanted dopant is activated, and then an interlayer dielectric 324 is formed. Next, after a predetermined contact hole has been opened in the interlayer dielectric 324, a metal layer is formed. After this, the metal layer is patterned to form a source electrode 326, a drain electrode 328, and the gate resistance lowering metal layer 330. Next, the semiconductor substrate 310 is connected to ground 332, thereby completing the lateral short-channel DMOS 30D.

As shown above, according to the method of manufacturing a lateral short-channel DMOS according to embodiment 6, it is possible to manufacture the superior lateral short-channel DMOS 30D according to embodiment 3D using a relatively simple method.

It should be noted that when manufacturing the lateral short-channel DMOS 30B according to embodiment 3B, in the fifth process (e) of the above method of manufacturing, the field oxide film 336 may be opened in a region from the P-type diffused region 338 to the N$^+$-type drain region 318 (the region that will become the N$^+$-type drain region 318).

Also, when manufacturing the lateral short-channel DMOS 30A according to embodiment 3A, in the fourth process (d) of the above method of manufacturing, a mask with a part that is not open corresponding to the P-type diffused region 338 may be used as the third ion implanting mask 354.

Also, when manufacturing the lateral short-channel DMOS 30E according to embodiment 3E, in the third and fourth processes (c) and (d) of the above method of manufacturing, the P-type diffused region 338 may be formed so as to not contact the ON resistance lowering N-type well 334.

Also, when manufacturing the lateral short-channel DMOS 30C according to embodiment 3C, in the third and fourth processes (c) and (d) of the above method of manufacturing, the P-type diffused region 338 may be formed so as to not contact the ON resistance lowering N-type well 334, and in the fifth process (e) the field oxide film 336 may be opened in a region from the P-type diffused region 338 to the N$^+$-type drain region 318.

Embodiment 7E

Figure 10:
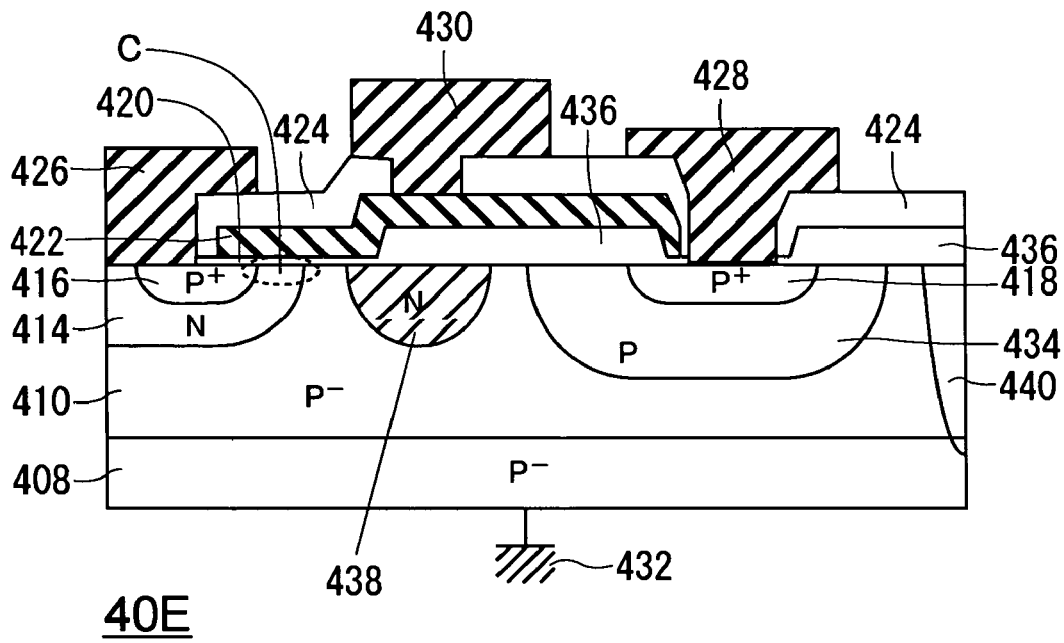
FIG. 10 is a cross-sectional view of a lateral short-channel DMOS according to embodiment 7E.

FIG. 10 is a cross-sectional view of a lateral short-channel DMOS 40E according to embodiment 7E. The lateral short-channel DMOS 40E is the lateral short-channel DMOS 10E according to embodiment 1E with the conductivity types (except that of the semiconductor substrate) having been reversed. With the lateral short-channel DMOS 40E the same effects as the lateral short-channel DMOS 10E can be obtained.

That is, when the DMOS 40E is ON, the ON resistance lowering P-type well 434 that has low resistance provides a large part of the current path from the P$^+$-type source region 416 to the P$^+$-type drain region 418, so that the overall ON resistance can be sufficiently lowered even when the gate length is extended to lower the gate resistance. Accordingly, the lateral short-channel DMOS has a low gate resistance and a low ON resistance, as well as superior high-speed switching characteristics and superior current driving characteristics.

Also, the ON resistance lowering P-type well 434 that includes a higher concentration of P-type dopant than the P$^-$-type epitaxial layer 410 is provided separately, so that the resistance when the DMOS 40E is ON can be lowered without increasing the concentration of dopant in the P$^-$-type epitaxial layer 410 itself and there is no worsening in the breakdown characteristics of the lateral short-channel DMOS.

Also, since the N-type diffused region 438 is formed in the P$^-$-type epitaxial layer 410, the electric field strength in a vicinity of a region in which the N-type diffused region 438 is formed is eased during reverse bias, so that the breakdown characteristics can be stabilized further. It should be noted that when the DMOS 40E is ON the current from the P$^+$-type source region 416 to the P$^+$-type drain region 418 avoids the N-type diffused region 438 and flows in a deeper part (the P$^-$-type epitaxial layer 410) than the N-type diffused region 438, so that there is no increase in the ON resistance due to the provision of the N-type diffused region 438.

Also, since the N-type diffused region 438 that is not biased is constructed so as to not contact the ON resistance lowering P-type well 434, it is possible to thoroughly suppress a worsening of the breakdown characteristics and increases in leak currents.

Also, since the polysilicon gate electrode 422 is provided opposite the P$^-$-type epitaxial layer 410 with the field oxide film 436 in between in a region from the N-type diffused region 438 to the P$^+$-type drain region 418, the capacity between the gate and the source and between the gate and the drain can be reduced, which further improves the high-speed switching characteristics.

Embodiment 8E

Figure 11A:
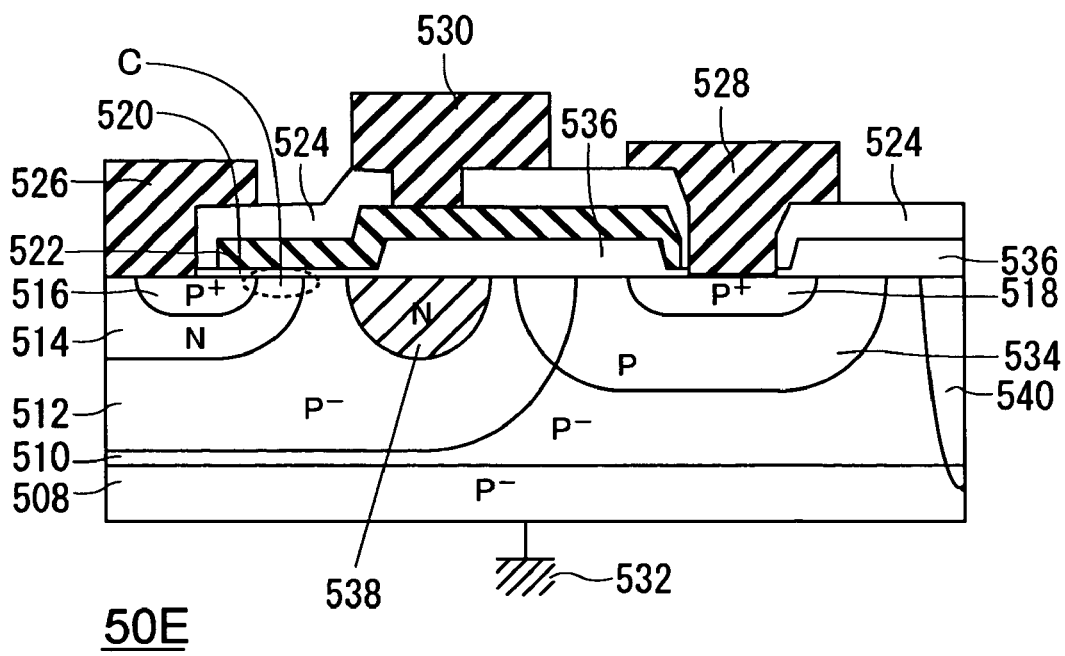
FIG. 11A is a cross-sectional view of a lateral short-channel DMOS according to embodiment 8E.

FIG. 11A is a cross-sectional view of a lateral short-channel DMOS 50E according to embodiment 8E. The lateral short-channel DMOS 50E is the lateral short-channel DMOS 20E according to embodiment 2E with the conductivity types (except that of the semiconductor substrate) having been reversed. With the lateral short-channel DMOS 50E the same effects as the lateral short-channel DMOS 20E can be obtained.

That is, when the DMOS 50E is ON, the ON resistance lowering P-type well 534 that has low resistance provides a large part of the current path from the P+-type source region 516 to the P+-type drain region 518, so that the overall ON resistance can be sufficiently lowered even when the gate length is extended to lowered the gate resistance. Accordingly, the lateral short-channel DMOS has a low gate resistance and a low ON resistance, as well as superior high-speed switching characteristics and superior current driving characteristics.

Also, the ON resistance lowering P-type well 534 that includes a higher concentration of P-type dopant than the P−-type well 512 is provided separately, so that the resistance when the DMOS 50E is ON can be lowered without increasing the concentration of dopant in the P−-type well 512 itself and there is no worsening in the breakdown characteristics of the lateral short-channel DMOS.

Also, by forming the P−-type well 512 inside the P−-type epitaxial layer 510, even in a semiconductor device, or the like, in which the lateral short-channel DMOS is integrated with other elements (logic elements, for example), the breakdown characteristics of the lateral short-channel DMOS can be controlled via the dopant concentration of the P−-type well 512. As a result, it is possible to set the dopant concentration of the P−-type epitaxial layer 510 at a suitable concentration (for example, a lower concentration than the P−-type well 512) for the other elements (for example, logic elements) and thereby provide a semiconductor device with superior characteristics.

Since the N-type diffused region 538 is formed in the P−-type well 512, the electric field strength in a vicinity of a region in which the N-type diffused region 538 is formed is eased during reverse bias, so that the breakdown characteristics can be stabilized further. It should be noted that when the DMOS 50E is ON, the current from the P+-type source region 516 to the P+-type drain region 518 avoids the N-type diffused region 538 and flows in a deeper part (the P−-type well 512) than the N-type diffused region 538, so that there is no increase in the ON resistance due to the provision of the N-type diffused region 538.

Also, since the N-type diffused region 538 that is not biased is constructed so as to not contact the ON resistance lowering P-type well 534, it is possible to thoroughly suppress a worsening of the breakdown characteristics and increases in leak currents.

Also, since the polysilicon gate electrode 522 is provided opposite the P−-type epitaxial layer 510 with the field oxide film 536 in between in a region from the N-type diffused region 538 to the P+-type drain region 518, the capacity between the gate and the source and between the gate and the drain can be reduced, which further improves the high-speed switching characteristics.

Embodiment 8F

Figure 11B:
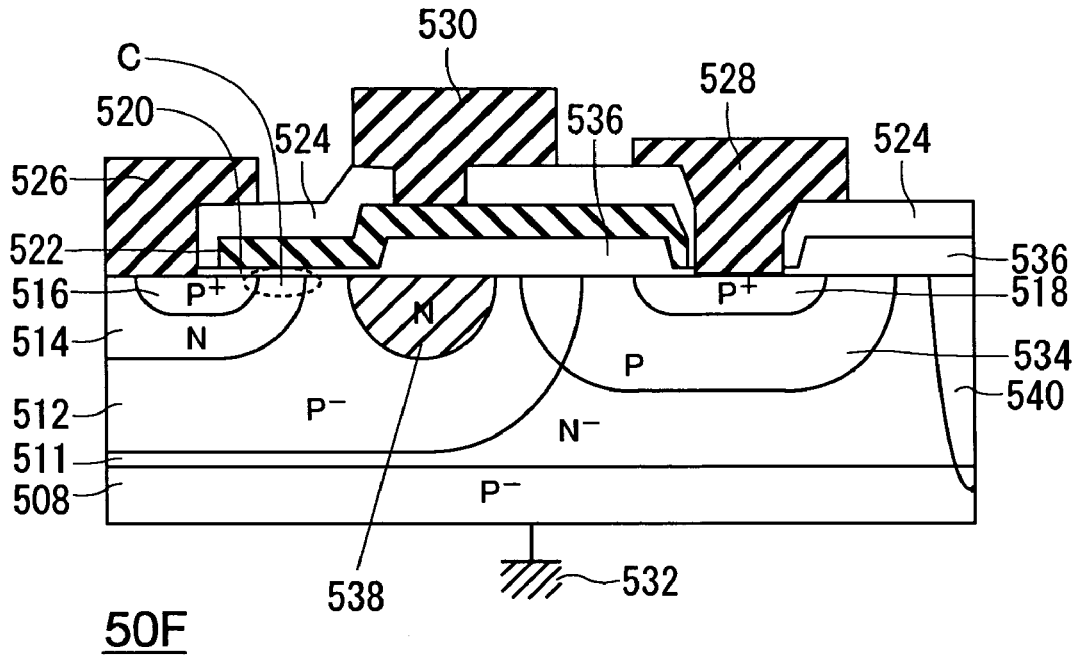
FIG. 11B is a cross-sectional view of a lateral short-channel DMOS according to embodiment 8F.

FIG. 11B is a cross-sectional view of a lateral short-channel DMOS according to embodiment 8F. A lateral short-channel DMOS 50F has a similar construction to the lateral short-channel DMOS 50E according to embodiment 8E, with as shown in FIG. 11B, the difference being that in an N−-type epitaxial layer 511, not the P−-type epitaxial layer 510, is formed on the surface of the P−-type semiconductor substrate 508.

In this way, according to the lateral short-channel DMOS 50F according to embodiment 8F, the N−-type epitaxial layer 511 is formed on the surface of the P−-type semiconductor substrate 508, but in the same way as the lateral short-channel DMOS 50E according to embodiment 8E, the P−-type well 512 is formed in the surface of the N−-type epitaxial layer 511, the N-type well 514 including the channel forming region C is formed in a surface of the P−-type well 512, and the P+-type source region 516 is formed in a surface of the N-type well 514. On the other hand, in the same way as the lateral short-channel DMOS 50E according to embodiment 8E, the ON resistance lowering N-type well 534 is formed in the surface of the N−-type epitaxial layer 511 so as to not contact the N-type well 514, and a P+-type drain region 518 is formed in a surface of the ON resistance lowering P-type well 534.

This means that the lateral short-channel DMOS 50F according to embodiment 8F has the same effects as the lateral short-channel DMOS 50E according to embodiment 8E.

Embodiment 9E

Figure 12:
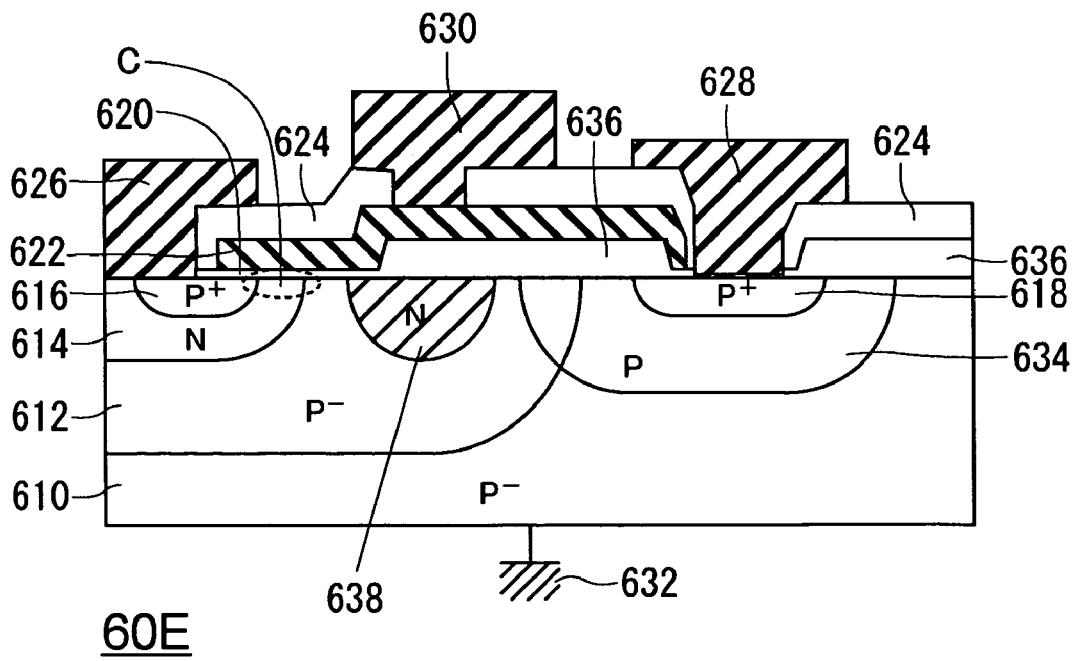
FIG. 12 is a cross-sectional view of a lateral short-channel DMOS according to embodiment 9E.
Figure 13:
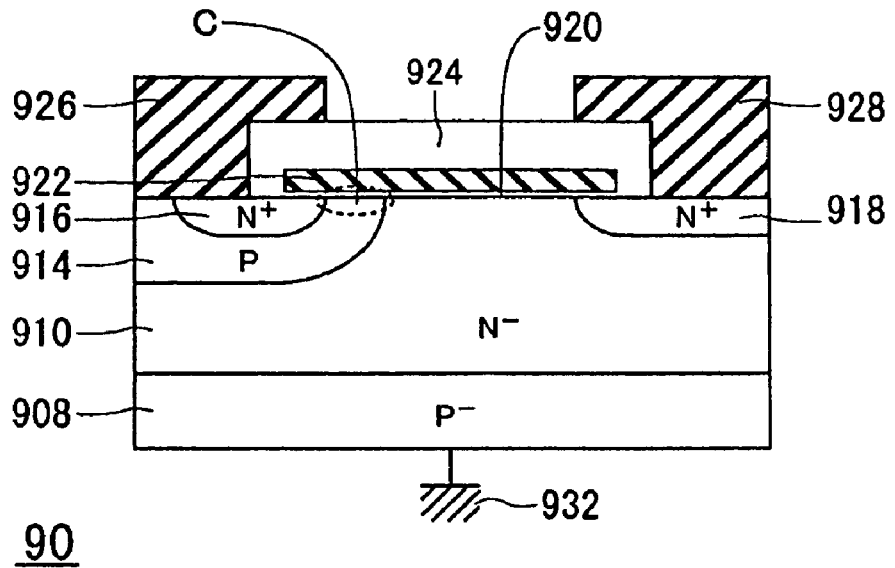
FIG. 13 is a cross-sectional view of a conventional lateral short-channel DMOS.
Figure 14:
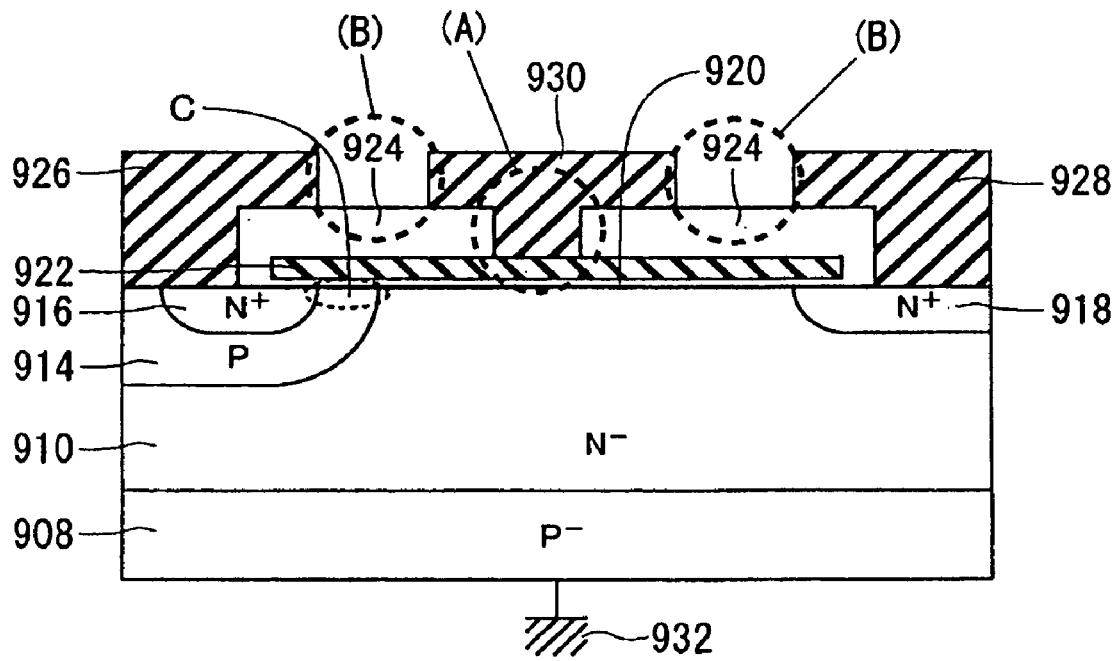
FIG. 14 is a cross-sectional view of a conventional lateral short-channel DMOS.

FIG. 12 is a cross-sectional view of a lateral short-channel DMOS 60E according to embodiment 9E. The lateral short-channel DMOS 60E is the lateral short-channel DMOS 30E according to embodiment 3E with the conductivity types (except that of the semiconductor substrate) having been reversed. With the lateral short-channel DMOS 60E the same effects as the lateral short-channel DMOS 30E can be obtained.

That is, when the DMOS 60E is ON, the ON resistance lowering P-type well 634 that has low resistance provides a large part of the current path from the P+-type source region 616 to the P+-type drain region 618, so that the overall ON resistance can be sufficiently lowered even when the gate length is extended to lower the gate resistance. Accordingly, the lateral short-channel DMOS has a low gate resistance and a low ON resistance, as well as superior high-speed switching characteristics and superior current driving characteristics.

Also, the ON resistance lowering P-type well 634 that includes a higher concentration of P-type dopant than the P−-type well 612 is provided separately, so that the resistance when the DMOS 60E is ON can be lowered without increasing the concentration of dopant in the P−-type well 612 itself and there is no worsening in the breakdown characteristics of the lateral short-channel DMOS.

It should be noted that in this lateral short-channel DMOS, although the P−-type well 612 needs to be formed relatively deeply from the surface of the P−-type semiconductor substrate 610 to maintain the breakdown characteristics of the lateral short-channel DMOS, the ON resistance lowering P-type well 634 only needs to act as a current path from the P+-type source region 616 to the P+-type drain region 618 and therefore may be formed relatively shallowly from the surface of the PN−-type semiconductor substrate 610. This means that little extension in the horizontal direction is required when forming the ON resistance lowering N-type well 634, and as a result the element area of the lateral short-channel DMOS does not become particularly large.

Also, since the N-type diffused region 638 is formed inside the P−-type well 612, the electric field strength in the vicinity of the region in which the N-type diffused region 638 is eased during reverse bias and it is possible to further stabilize the breakdown characteristics. It should be noted that when the DMOS 60E is ON, the current from the P+-type source region 616 to the P+-type drain region 618 avoids the N-type diffused region 638 and flows in a deeper part (the P−-type well 612) than the N-type diffused region 638, so that there is no increase in the ON resistance.

Since the N-type diffused region 638 that is not biased is constructed so as to not contact the ON resistance lowering P-type well 634, it is possible to thoroughly suppress a worsening of the breakdown characteristics and increases in leak currents.

Also, since the polysilicon gate electrode 622 is provided opposite the P⁻-type semiconductor substrate 610 with the field oxide film 636 in between in a region from the N-type diffused region 638 to the P⁺-type drain region 618, the capacity between the gate and the source and between the gate and the drain can be reduced, which further improves the high-speed switching characteristics.

As described above, according to the present invention, it is possible to provide a lateral short-channel DMOS with low gate resistance and low ON resistance, as well as superior high-speed switching characteristics and superior current driving characteristics. Also, according to the present invention, it is possible to manufacture the above superior lateral short-channel DMOS using a relatively simple method.

The invention claimed is:

1. A lateral short-channel DMOS, comprising:
an epitaxial layer formed on a surface of a semiconductor substrate;
a first conductivity-type well formed in a surface of the epitaxial layer;
a second conductivity-type well that is formed in a surface of the first conductivity-type well and includes a channel forming region, the second conductivity type being an inverse of the first conductivity type;
a first conductivity-type source region that is formed in a surface of the second conductivity-type well;
a first conductivity-type ON resistance lowering well that is formed in a surface of the epitaxial layer so as to contact the first conductivity-type well and to not contact the second conductivity-type well, and includes a higher concentration of a first conductivity-type dopant than the first conductivity-type well;
a first conductivity-type drain region formed in a surface of the first conductivity-type ON resistance lowering well;
a gate electrode formed, via a gate insulating film, in an upper part of at least the channel forming region, out of a region from the first conductivity-type source region to the first conductivity-type drain region; and
a gate resistance lowering metal layer connected to the gate electrode;
wherein
a second conductivity-type diffused region is formed in a floating state in a surface of the first conductivity-type well in a region between the second conductivity-type well and the first conductivity-type drain region so as to not contact the second conductivity-type well; and
the second conductivity-type diffused region is formed so as to not contact the first conductivity-type ON resistance lowering well.

2. A lateral short-channel DMOS according to claim 1, further comprising a field oxide film extending from the second conductivity-type diffused region to the first conductivity-type drain region, and located between the gate electrode and the epitaxial layer.

3. A semiconductor device including a lateral short-channel DMOS according to claim 1.

4. A semiconductor device including a lateral short-channel DMOS according to claim 2.

5. A lateral short-channel DMOS, comprising:
an epitaxial layer formed on a surface of a semiconductor substrate;
a first conductivity-type well formed in a surface of the epitaxial layer;
a second conductivity-type well that is formed in a surface of the first conductivity-type well and includes a channel forming region, the second conductivity type being an inverse of the first conductivity type;
a first conductivity-type source region that is formed in a surface of the second conductivity-type well;
a first conductivity-type ON resistance lowering well that is formed in a surface of the epitaxial layer so as to contact the first conductivity-type well and to not contact the second conductivity-type well, and includes a higher concentration of a first conductivity-type dopant than the first conductivity-type well;
a first conductivity-type drain region formed in a surface of the first conductivity-type ON resistance lowering well;
a gate electrode formed above and insulated from at least the channel forming region; wherein the first conductivity-type ON resistance lowering well is not entirely formed in said surface of the first conductivity-type well; and
a second conductivity-type diffused region that is formed in a floating state in a surface of the first conductivity-type well in a region between the second conductivity-type well and the first conductivity-type drain region so as not to contact the second conductivity-type well;
wherein the second conductivity-type diffused region is formed so as not to contact the first conductivity-type ON resistance lowering well.

6. A lateral short-channel DMOS according to claim 5, further comprising a field oxide film extending from the second conductivity-type diffused region to the first conductivity-type drain region, and located between the gate electrode and the epitaxial layer.

7. A semiconductor device including a lateral short-channel DMOS according to claim 5.

8. A semiconductor device including a lateral short-channel DMOS according to claim 6.

9. A lateral short-channel DMOS, comprising:
an epitaxial layer formed on a surface of a semiconductor substrate;
a first conductivity-type well formed in a surface of the epitaxial layer;
a second conductivity-type well that is formed in a surface of the first conductivity-type well and includes a channel forming region, the second conductivity type being an inverse of the first conductivity type;
a first conductivity-type source region that is formed in a surface of the second conductivity-type well;
a first conductivity-type ON resistance lowering well that is formed in a surface of the epitaxial layer so as to contact the first conductivity-type well and to not contact the second conductivity-type well, and includes a higher concentration of a first conductivity-type dopant than the first conductivity-type well;
a first conductivity-type drain region formed in a surface of the first conductivity-type ON resistance lowering well;
a gate electrode formed above and insulated from at least the channel forming region; wherein the first conductivity-type ON resistance lowering well is not entirely formed in said surface of the first conductivity-type well; and a second conductivity-type diffused region that is formed in a floating state in a surface of the first conductivity-type well in a region between the second conductivity-type well and the first conductivity-type drain region so as to not contact both the second conductivity-type well and the first conductivity-type drain region;

wherein the second conductivity-type diffused region is formed so as not to contact the first conductivity-type ON resistance lowering well.

10. A lateral short-channel DMOS according to claim 9, further comprising a field oxide film extending from the second conductivity-type diffused region to the first conductivity-type drain region, and located between the gate electrode and the epitaxial layer.

11. A semiconductor device including a lateral short-channel DMOS according to claim 9.

12. A semiconductor device including a lateral short-channel DMOS according to claim 10.

* * * * *